United States Patent
Patel et al.

(10) Patent No.: US 10,453,583 B2
(45) Date of Patent: Oct. 22, 2019

(54) BORON FILLED HYBRID NANOTUBES

(71) Applicants: Rajen Bhupendra Patel, Parsippany, NJ (US); Zafar Iqbal, Morris Plains, NJ (US)

(72) Inventors: Rajen Bhupendra Patel, Parsippany, NJ (US); Zafar Iqbal, Morris Plains, NJ (US)

( * ) Notice: Subject to any disclaimer, the term of this patent is extended or adjusted under 35 U.S.C. 154(b) by 50 days.

(21) Appl. No.: 15/249,349

(22) Filed: Aug. 27, 2016

(65) Prior Publication Data

US 2018/0057359 A1    Mar. 1, 2018

(51) Int. Cl.

| | |
|---|---|
| *H01B 1/04* | (2006.01) |
| *B82Y 30/00* | (2011.01) |
| *C23C 14/24* | (2006.01) |
| *C23C 14/06* | (2006.01) |
| *B01J 37/02* | (2006.01) |
| *C09K 5/14* | (2006.01) |
| *C01B 35/04* | (2006.01) |

(Continued)

(52) U.S. Cl.
CPC .............. *H01B 1/04* (2013.01); *B01J 23/745* (2013.01); *B01J 23/755* (2013.01); *B01J 37/0238* (2013.01); *C01B 32/178* (2017.08); *C01B 35/04* (2013.01); *C01B 35/06* (2013.01); *C09K 5/14* (2013.01); *C23C 14/0605* (2013.01); *C23C 14/228* (2013.01); *C23C 14/24* (2013.01); *C23C 16/26* (2013.01); *C23C 16/4418* (2013.01)

(58) Field of Classification Search
CPC .......... B82Y 30/00; B82Y 40/00; H01B 1/04; C01B 32/178; C01B 35/06

USPC ...................... 252/521.4, 500, 502; 977/773
See application file for complete search history.

(56) References Cited

U.S. PATENT DOCUMENTS

2009/0246521 A1* 10/2009 Swift ................ B29C 70/025
                                                428/401

FOREIGN PATENT DOCUMENTS

KR         20150010198 A  *  1/2015  ............... B82B 3/00

OTHER PUBLICATIONS

Goldberg ("Heterogeneous Nanotubes: (X*CNTs, X*BNNTs)" Chapter 6 in Carbon Meta-Nanotubes: Synthesis, Properties and Applications, First Edition. Edited by Marc Monthioux). (Year: 2012).*

(Continued)

*Primary Examiner* — Tri V Nguyen
(74) *Attorney, Agent, or Firm* — Ashok Tankha

(57) ABSTRACT

A boron filled hybrid nanotube and a method for producing and rendering boron filled hybrid nanotubes suitable for applications are provided. A mixture of a boron containing nanowire producing compound and catalysts is prepared and ground for a predetermined time period. The ground mixture is subjected to a vapor deposition process including passing an inert gas over the ground mixture after adding a nanotube producing compound to the ground mixture or after passing a reactant gas on the ground mixture in a reactor at a configurable reaction temperature and a configurable reaction pressure for a configurable reaction time to produce the boron filled hybrid nanotubes with enhanced mechanical, thermal and electrical properties. Each boron filled hybrid nanotube includes one or more boron based nanowires embedded within one or more single walled or multi-walled nanotubes. The boron filled hybrid nanotubes are further purified and functionalized using acids, and/or bases, and/or surfactants.

1 Claim, 14 Drawing Sheets

(51) Int. Cl.
*C01B 35/06* (2006.01)
*C23C 14/22* (2006.01)
*C23C 16/26* (2006.01)
*C23C 16/44* (2006.01)
*C01B 32/178* (2017.01)
*B01J 23/745* (2006.01)
*B01J 23/755* (2006.01)
*C01B 35/02* (2006.01)
*B82B 3/00* (2006.01)

(56) References Cited

OTHER PUBLICATIONS

Han ("Formation of (BN)xCy and BN Nanotubes Filled with Boron Carbide Nanowires." Chem. Mater. 1999, 11, 3620-3623) (Year: 1999).*
Patel ("Boron-Filled Hybrid Carbon Nanotubes." Scientific Reports, 6:30495). Online Jul. 27, 2016. (Year: 2016).*
Patel 2013 "Synthesis and characterization of novel boron-based nanostructures and composites" (Order No. 3709376). Available from Matericals Science & Engineering Dissertations; ProQuest Dissertations & Theses Global: Science & Technology. (Year: 2013).*

\* cited by examiner

BORON FILLED HYBRID NANOTUBES

BACKGROUND

Carbon forms a large number of nanostructures, for example, nanotubes, buckyballs, nanopaper, buckypaper, bundles, graphene, etc. Typically, carbon nanotubes exhibit unique mechanical properties, for example, high strength and ductility. Carbon nanotubes possess a Young's modulus in the order of, for example, about 270 gigapascal (GPa) to about 950 GPa, and a tensile strength of, for example, about 11 GPa to about 63 GPa. The radial mechanical properties of carbon nanotubes are generally inadequate and carbon nanotubes do not perform well under compression compared to when the carbon nanotubes are under tension because of their structural anisotropy and hollow cores. Since production of substantially long carbon nanotubes is difficult, carbon nanotubes are typically mixed with other materials to form composites, or are agglomerated into bundles, or are made into buckypaper to make the carbon nanotubes amenable for macroscale applications. In composites, inadequate adhesion of the carbon nanotubes to a matrix material results in substandard performance of the composites. The weak bonding of adjacent carbon nanotubes in bundles and buckypaper nanostructures limits the strength of the bundles and the buckypaper nanostructures.

Similarly, multi-walled carbon nanotubes with few bonding sites possess less wall-to-wall adhesion, causing super lubricity which leads to outer walls of the multi-walled carbon nanotubes bearing the majority of any mechanical loading on the multi-walled carbon nanotubes. Mechanical loading on the multi-walled carbon nanotubes relates to compression, or tension, or torsion, or bending, or any combination thereof, on the multi-walled carbon nanotubes. To resolve the issue of less wall-to-wall adhesion, functional groups are added to the carbon nanotubes or radiation is used to induce defects in the carbon nanotubes after the production of the carbon nanotubes. The induced defects in the carbon nanotubes help to bond adjacent walls and nanotubes in the multi-walled carbon nanotubes. While improving adhesion, functionalizing these carbon structures is detrimental to the intrinsic mechanical properties of the carbon structures. The process of adding a functional group to the carbon nanotubes after the production of the carbon nanotubes is referred to as functionalization. In general, for a multi-walled nanostructure, enhanced wall-to-wall adhesion improves mechanical properties of the multi-walled nanostructure.

Carbon nanotubes, in general, are either semiconducting or conducting. There is a need for carbon nanotubes with enhanced insulation properties for certain applications, for example, energy storage or electrical shielding. For applications that involve, for example, energy storage or electrical shielding, there is a need for a material with similar dimensions and mechanical properties as that of carbon nanotubes. Radiation shielding is required in multiple applications, for example, aerospace applications, nuclear applications, etc. In general, carbon nanotubes are poor in shielding certain types of radiation, for example, gamma radiation, X-radiation, ultraviolet radiation, etc. If enriched boron or depleted boron can be added to carbon nanotubes, the carbon nanotubes can be enhanced to provide protection against harmful radiation. Enhanced adhesion to matrix materials in composites of carbon nanotubes creates multiple applications for composites of carbon nanotubes. Typically, carbon nanotubes are functionalized to provide additional functionality to the carbon nanotubes by providing a path for tailoring properties of the carbon nanotubes. However, carbon nanotubes are difficult to functionalize and the functionalization only occurs at defect sites in the structure of the carbon nanotubes. If more functionalization sites are added to the carbon nanotube structure, most likely, more types and more effective functionalization will result.

Hence, there is a long felt need for a method for producing boron filled hybrid nanotubes that are insulating, exhibit enhanced mechanical properties, thermal properties, and electrical properties, can be effectively functionalized, and provide radiation shielding. Moreover, there is a need for a boron filled hybrid nanotube that exhibits enhanced adhesion to matrix materials in composites. Furthermore, there is a need for a boron filled hybrid nanotube that possesses a corrugated structure that allows mechanical loading to be transferred from the outer walls of the boron filled hybrid nanotube to the inner walls of the boron filled hybrid nanotube, and thereafter to a boron filled core of the boron filled hybrid nanotube.

SUMMARY OF THE INVENTION

This summary is provided to introduce a selection of concepts in a simplified form that are further disclosed in the detailed description of the invention. This summary is not intended to determine the scope of the claimed subject matter.

The method disclosed herein addresses the above mentioned need for producing boron filled hybrid nanotubes that are insulating, exhibit enhanced mechanical properties, thermal properties and electrical properties, and that can be effectively functionalized and provide radiation shielding. Moreover, the boron filled hybrid nanotube disclosed herein exhibits enhanced adhesion to matrix materials in composites. Furthermore, the boron filled hybrid nanotube disclosed herein possesses a corrugated structure that allows mechanical loading to be transferred from outer walls of a multi-walled boron filled hybrid nanotube to inner walls of the multi-walled boron filled hybrid nanotube, and thereafter to a boron filled core of the boron filled hybrid nanotube.

In the method disclosed herein, in an embodiment, a mixture comprising about 0% to about 90% by weight of a nanotube producing compound, about 5% to about 90% by weight of a boron containing nanowire producing compound, and about 5% to about 90% by weight of catalysts is prepared and ground for a predetermined time period, for example, in a mixer with grinding media. "0% by weight" of the nanotube producing compound indicates absence of the nanotube producing compound in the mixture in an embodiment for producing a nanotube. In the 0% by weight of the nanotube producing compound embodiment, a predetermined percentage by volume of a reactant gas is used as a source for producing the nanotube in the boron filled hybrid nanotube. The ground mixture is subjected to a vapor deposition process comprising passing about 0% to about 100% by volume of a reactant gas and about 0% to about 100% by volume of an inert gas over the ground mixture in a reactor at a configurable reaction temperature and a configurable reaction pressure for a configurable reaction time to produce boron filled hybrid nanotubes with enhanced mechanical properties, enhanced thermal properties, and enhanced electrical properties. "0% by volume" of the reactant gas indicates absence of the reactant gas as a precursor in an embodiment for producing the nanotube. In the 0% by volume of the reactant gas embodiment, a predetermined percentage by weight of the nanotube producing compound is used as the source for producing the nanotube in the boron filled hybrid nanotube. "0% by volume" of the inert gas indicates absence of the inert gas as a precursor in an embodiment for producing the boron filled hybrid nanotubes. When the ground mixture is subjected to the vapor deposition process in which a reactant gas, for example, a carbon containing gas and an inert gas are passed over the ground mixture in a furnace at a preset temperature and a preset pressure for a preset time, the vapor deposition process deposits molecules, for example, carbon containing molecules on the ground mixture to produce boron filled hybrid nanotubes.

The boron filled hybrid nanotubes exhibit enhanced mechanical properties, enhanced thermal properties, and enhanced electrical properties. The boron filled hybrid nanotubes produced comprise one or more boron based nanowires embedded within one or more single walled nanotubes and/or one or more multi-walled nanotubes. In an embodiment, the boron filled hybrid nanotubes are purified and functionalized using a purifying agent to produce purified boron filled hybrid nanotubes with enhanced mechanical properties, enhanced thermal properties, and enhanced electrical properties. The boron filled hybrid nanotubes are configured in one or more forms comprising, for example, a composite, a nanopaper such as a buckypaper, a spooled bundle, a film, one or more bundles, etc. The boron filled hybrid nanotubes find applications in multiple domains comprising, for example, electronics, mechanical domain, nuclear domain, chemical domain, etc.

BRIEF DESCRIPTION OF THE DRAWINGS

The foregoing summary, as well as the following detailed description of the invention, is better understood when read in conjunction with the appended drawings. For the purpose of illustrating the invention, exemplary constructions of the invention are shown in the drawings. However, the invention is not limited to the specific methods and structures disclosed herein. The description of a method step or a structure referenced by a numeral in a drawing is applicable to the description of that method step or structure shown by that same numeral in any subsequent drawing herein.

DETAILED DESCRIPTION OF THE INVENTION

Figure 1A:
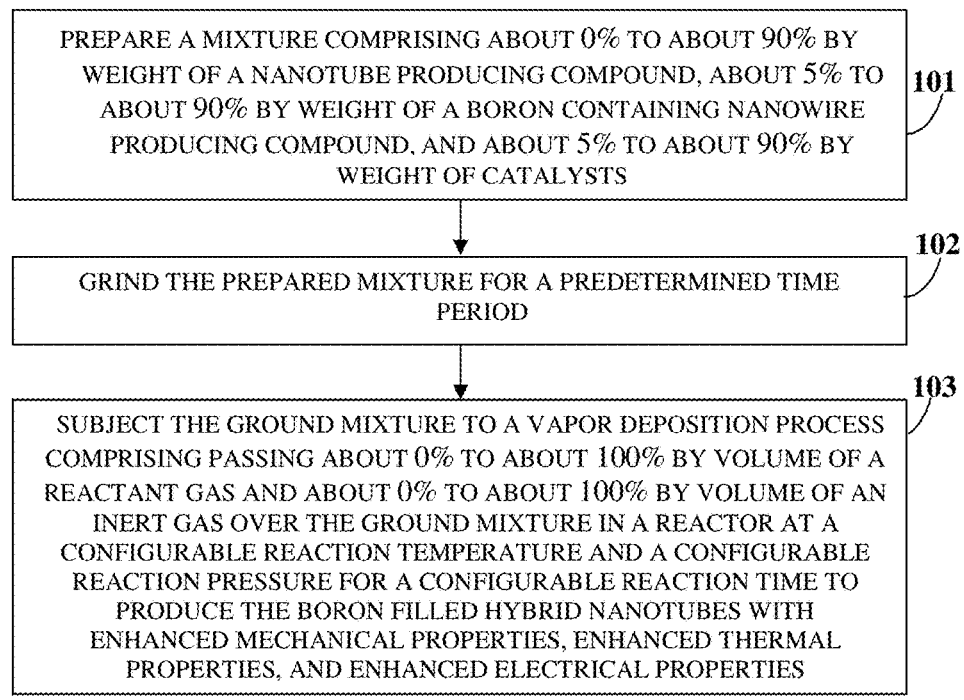
FIG. 1A illustrates a method for producing boron filled hybrid nanotubes comprising one or more boron based nanowires embedded within one or more single walled nanotubes and/or one or more multi-walled nanotubes.

FIG. 1A illustrates a method for producing boron filled hybrid nanotubes comprising one or more boron based nanowires embedded within one or more single walled nanotubes and/or one or more multi-walled nanotubes. Schematic representations of single walled and multi-walled boron filled hybrid nanotubes are exemplarily illustrated in FIGS. 4A-4E. As used herein, the term "nanotube" refers to a nanometer scale cylindrical tube like structure of an element or a compound. Nanotubes are hollow cylinders formed by rolled flat sheets of a constituent material, for example, carbon with weak bonding between walls of the hollow cylinders. Nanotubes are grown to a diameter as small as about 0.5 nanometer (nm) and can be nested to form multi-walled architectures. Nanotubes are classified as single walled nanotubes with a single cylindrical wall, and multi-walled nanotubes that are composed of more than one cylindrical wall. Elements and compounds that have a layered hexagonal crystal structure generally form nanotubes. Carbon forms nanotubes with its graphitic crystal structure. Carbon nanotubes find more applications than nanotubes made from other elements and compounds because of the unique electrical and mechanical properties of carbon nanotubes. Carbon nanotubes are held together through conjugated carbon-carbon network bonding. In multi-walled carbon nanotubes, the individual concentric walls of cylinders are held together by non-covalent π-π stacking interactions similar to that of the layers in graphite. Boron nitride is another material that also forms flat layers similar to graphite. In an embodiment, boron nitride is used to make a variety of nanostructures similar to carbon.

Also, as used herein, the term "nanowire" refers to a nanomaterial with two dimensions less than 1000 nm. As used herein, a nanomaterial has some or all dimensions restricted to less than 1000 nm. Nanowires are one dimensional anisotropic structures that exhibit enhanced material properties because of unique aspect ratios. Aspect ratio of a nanowire is defined as a ratio of the length of the nanowire to a diameter of the nanowire. Nanowires of different elemental compositions exist and are classified into superconducting nanowires, metallic nanowires, semiconducting nanowires, insulating nanowires, molecular nanowires, etc. Nanowires are fully dense and typically retain the three-dimensional crystal structures of their constituent elements. Also, as used herein, "boron based nanowires" refer to nanowires synthesized using pure boron and/or boron compounds. Pure boron means that the vast majority of constituent boron in the structure of boron based nanowires is not a boron based compound, for example, boron nitride, magnesium diboride, etc. Boron exhibits a tendency to form covalent molecular compounds even with an electron deficiency and has a large Young's modulus and extreme hardness. Boron based nanowires are thermodynamically stable and exhibit enhanced thermal properties and enhanced mechanical properties over bulk forms of boron, for example, α-rhombohedral boron, β-rhombohedral boron, and β-tetragonal boron. Also, as used herein, "boron filled hybrid nanotubes" refer to nanotubes comprising the boron based nanowires embedded within one or more single walled nanotubes and/or one or more multi-walled nanotubes, where the single walled nanotubes and/or multi-walled nanotubes surround the boron based nanowires embedded therewithin. The boron based nanowires form the filled core of the hybrid nanotubes. Hybrid nanotubes refer to nanotubes comprised of one of boron nitride, boron carbon nitride, titania, carbon, zinc oxide, tungsten sulfide, halogenide, silicon, chalcogenide, carbon organic materials, or any combination thereof.

The method for producing boron filled hybrid nanotubes is a vapor deposition process involving a solid-solid-gas reaction performed at high temperatures in a furnace with an inert gas flowing continuously over the reactants. A vapor deposition process is a process in which reactants in a vapor state are condensed through condensation, a chemical reaction, or conversion to form a product. A solid-solid-gas reaction is a reaction where reactants in a solid phase and a gaseous phase react together to form a product. In the method disclosed herein and illustrated in FIG. 1A, a mixture, hereinafter "mixture", comprising about 0% to about 90% by weight of a nanotube producing compound, about 5% to about 90% by weight of a boron containing nanowire producing compound, and about 5% to about 90% by weight of catalysts is prepared 101. 0% by weight of the nanotube producing compound indicates absence of the nanotube producing compound in the mixture in an embodiment for producing a nanotube. In an embodiment, the range of concentration of the nanotube producing compound is about 42.5% to about 54% by weight of the mixture, the range of concentration of the boron containing nanowire producing compound is about 42.5% to about 54% by weight of the mixture, and the range of concentration of the catalysts is about 5% by weight to about 20% by weight of the mixture. In another embodiment, the range of concentration of the nanotube producing compound is about 42.5% to about 54% by weight of the mixture, the range of concentration of the boron containing nanowire producing compound is about 42.5% to about 45% by weight of the mixture, and the range of concentration of the catalysts is about 10% by weight to about 15% by weight of the mixture. In an example, the mixture is prepared using about 47.5% by weight of the nanotube producing compound, about 47.5% by weight of the boron containing nanowire producing compound, and about 5% by weight of catalysts. In the above embodiments, the nanotube producing compound is added to the mixture in a solid form as a precursor for producing a nanotube in a solid-solid reaction. A solid-solid reaction is a reaction where reactants in a solid phase react together to form a product. In an embodiment, the mixture is prepared using about 5% to about 90% by weight of a boron containing nanowire producing compound and about 5% to about 90% by weight of catalysts, without the nanotube producing compound. In this embodiment, a nanotube producing reactant gas is passed over the mixture to produce the nanotube during the vapor deposition process as disclosed below. In this embodiment, a predetermined percentage by volume of a reactant gas is used as a source for producing the nanotube in a boron filled hybrid nanotube.

After preparing the mixture, the prepared mixture is ground 102, for example, in a mixer such as an agate mortar with grinding media and a rotary mixer for a predetermined time period, for example, about one hour. The grinding media comprise, for example, milling balls made of steel, stainless steel, cylindrical ceramic pieces, etc. The ground mixture is subjected 103 to a vapor deposition process comprising, for example, passing about 0% to about 100% by volume of a reactant gas and about 0% to about 100% by volume of an inert gas over the ground mixture in a reactor, for example, a quartz reactor at a configurable reaction temperature and a configurable reaction pressure for a configurable reaction time. "0% by volume" of the reactant gas indicates absence of the reactant gas as a precursor in an embodiment for producing the nanotube. In the 0% by volume of the reactant gas embodiment, a predetermined percentage by weight of the nanotube producing compound in the mixture is used as the source for producing the nanotube in a boron filled hybrid nanotube. That is, in the 0% by volume of the reactant gas embodiment, the vapor deposition process is performed on the ground mixture of about 5% to about 90% by weight of a nanotube producing compound, about 5% to about 90% by weight of a boron containing nanowire producing compound, and about 5% to about 90% by weight of catalysts by passing about 0% to about 100% by volume of an inert gas over the ground mixture.

In an example, the vapor deposition process is performed on a ground mixture comprising about 5% to about 90% by weight of a boron containing nanowire producing compound and about 5% to 90% by weight of catalysts by passing about 0.1% to about 99.9% by volume of a reactant gas and about 0.1% to about 99.9% by volume of an inert gas on the ground mixture in the reactor. In an example, the range of concentration of the reactant gas is about 8% to about 12% by volume and the range of concentration of the inert gas is about 88% to about 92% by volume. In the "0% by volume" of the inert gas embodiment, the 0% by volume of the inert gas indicates absence of the inert gas as a precursor in an embodiment for producing the boron filled hybrid nanotube.

In another example, the mixture is prepared using about 47.5% by weight of the nanotube producing compound, about 47.5% by weight of the boron containing nanowire producing compound, and about 5% by weight of catalysts. The prepared mixture is then ground in a mixer. The vapor deposition process is performed on the ground mixture by passing 100% by volume of an inert gas over the ground mixture in the reactor. In another example, the mixture is prepared using about 90% by weight of the boron containing nanowire producing compound and about 10% by weight of catalysts. The prepared mixture is then ground in a mixer.

The vapor deposition process is performed on the ground mixture by passing about 9.1% by volume of a reactant gas and about 90.9% by volume of an inert gas over the ground mixture in the reactor. In another example, the mixture is prepared using about 90% by weight of the boron containing nanowire producing compound and about 10% by weight of catalysts. The prepared mixture is then ground in a mixer. The vapor deposition process is performed on the ground mixture by passing about 100% by volume of a reactant gas over the ground mixture in the reactor and without using the inert gas as a precursor for producing the boron filled hybrid nanotube.

The reaction temperature for the vapor deposition process is a configurable reaction temperature that varies, for example, from about 500° C. to about 1500° C. The configurable reaction pressure for the vapor deposition process varies, for example, from about 0 bar to about 300 bar. The configurable reaction time for the vapor deposition process varies, for example, from about 1 second to about 1 week. The configurable reaction temperature, the configurable reaction pressure, and the configurable reaction time vary for different combinations of nanotube producing compounds, boron containing nanowire producing compounds, catalysts, and reactant gases.

On completion of the reaction in the reactor, boron filled hybrid nanotubes with enhanced mechanical properties, enhanced thermal properties, and enhanced electrical properties are produced. The boron filled hybrid nanotubes comprise one or more boron based nanowires embedded within one or more single walled nanotubes and/or one or more multi-walled nanotubes. The single walled nanotubes and/or multi-walled nanotubes are grown around the boron based nanowires, with both materials grown in situ, creating the boron filled hybrid nanotubes. In an embodiment, the method disclosed herein produces a boron filled hybrid nanotube comprising one boron based nanowire embedded within one single walled nanotube. In another embodiment, the method disclosed herein produces boron filled hybrid nanotubes, with each boron filled hybrid nanotube comprising multiple boron based nanowires embedded within a single walled nanotube. In another embodiment, the method disclosed herein produces a boron filled hybrid nanotube comprising one boron based nanowire embedded within one multi-walled nanotube. In another embodiment, the method disclosed herein produces a boron filled hybrid nanotube comprising multiple boron based nanowires embedded within one multi-walled nanotube. In another embodiment, the method disclosed herein produces a boron filled hybrid nanotube comprising more than one boron based nanowire embedded within more than one multi-walled nanotube. The conditions of the vapor deposition process are altered to produce the above different embodiments of the boron filled hybrid nanotubes and other embodiments of the boron filled hybrid nanotubes comprising one or more boron based nanowires embedded within one or more single walled nanotubes and/or multi-walled nanotubes. For example, gas conditions such as flow rate, etc., are altered, the pressure is increased, and the temperature is varied in the vapor deposition process to produce the above mentioned embodiments and other embodiments of the boron filled hybrid nanotubes.

In the 0% by volume of the reactant gas embodiment, the nanotube producing compound forms the outer single walled nanotube and/or multi-walled nanotube surrounding the boron based nanowires in the produced boron filled hybrid nanotubes. The nanotube producing compound is, for example, one of boron nitride, boron carbon nitride, titania, carbon, zinc oxide, tungsten sulfide, halogenide, silicon, chalcogenide, carbon organic materials such as phthalocyanines, porphyrins, etc., or any combination thereof. The boron containing nanowire producing compound forms the filled core of the produced boron filled hybrid nanotubes. The boron containing nanowire producing compound is, for example, pure boron or a compound of boron. Compounds of boron are, for example, boron oxide, boron nitride, magnesium diboride, calcium hexaboride, borane, borohydrides, boron hydride borohydrides, boron based amorphous glasses, iron boride, nickel boride, titanium diboride, rhenium diboride, zirconium diboride, metallic borides, compounds having free boron, organic molecules containing boron, etc., and any combination thereof. Catalysts are used in the reaction to speed up or enable the reaction, and remain chemically unchanged in the reaction. Catalysts used in the vapor deposition process are, for example, a metal catalyst, magnesium diboride, titanium diboride, iron boride, nickel boride, rhenium diboride, zirconium diboride, pure boron, boron oxide, boron carbide, a boride containing ceramic, calcium hexaboride, borane, boron hydride borohydrides, boron based amorphous glasses, organic compounds containing boron, metallic borides, a metal boride based catalyst, a mesostructured hexagonal framework mobil composition of matter No. 41 zeolite powder, etc., and any combination thereof.

In an embodiment, about 0% to about 99% by weight of a substrate material is added to the prepared mixture. As used herein, "substrate material" refers to a base material on which the boron filled hybrid nanotube is grown. "0% by weight" of the substrate material indicates absence of the substrate material in an embodiment for producing the boron filled hybrid nanotube. In an embodiment, a range of concentration of the substrate material is about 20% by weight to about 40% by weight of the prepared mixture. For example, about 30% by weight of the substrate material is added to the prepared mixture. The substrate material also contributes to the vapor deposition process by participating in a chemical vapor deposition reaction which produces the boron filled hybrid nanotubes and providing a template for the growth of nanomaterials, for example, the nanotube and the boron based nanowire. The substrate material provides a shape for the nanotubes to grow into, thus providing a template for the growth of the nanomaterials. The substrate material is, for example, one of porous silicon, an aerogel, a carbon based gel, a porous ceramic, an electrical templated metal, an electrical templated semiconductor, quantum dots, nano based powders, etc., or any combination thereof.

The vapor deposition process is a process used to deposit layers of a constituent material, for example, carbon, boron, or organic molecules containing carbon and boron, atom-by-atom or molecule-by-molecule on a surface of the substrate material. The vapor deposition process is a chemical vapor deposition process, or in an embodiment, a physical vapor deposition process based on the method used to deposit the constituent material on the substrate material. The vapor deposition process operates, for example, from a pressure below atmospheric pressure to a pressure up to 300 bar. In the physical vapor deposition process, the constituent material is physically transported to the surface of the substrate material. In the chemical vapor deposition process, the constituent material undergoes a chemical reaction along with or without the substrate material. The product of the chemical reaction is the boron filled hybrid nanotube along with byproducts comprising exhaust gases and solids. The vapor deposition process used for producing boron filled hybrid nanotubes is typically a chemical vapor deposition process. The prepared mixture of the boron containing nanowire producing compound and the catalysts is loaded into a quartz reactor of a chemical vapor deposition system for the chemical vapor deposition process as disclosed in the detailed description of FIG. 3, and the prepared mixture is heated to a reaction temperature with the mixture of a nanotube producing reactant gas and an inert gas in the quartz reactor. The reactant gases act as chemical vapor precursors in the chemical vapor deposition process. In an embodiment, the vapor deposition process used is a physical vapor deposition process, where the nanotube producing compound acts as a solid precursor for producing the nanotubes, instead of the reactant gas that is used to produce the nanotubes. In this embodiment, a mixture of the nanotube producing compound, the boron containing nanowire producing compound, and the catalysts are ground in the mixer and heated to a reaction temperature with an inert gas in the quartz reactor. In the physical vapor deposition process, only solid precursors are used and no reactant gases are needed to produce the boron filled hybrid nanotubes. The solid precursors are physically deposited on the substrate material. In the chemical vapor deposition process, the reactant gas replaces the solid precursors used in the physical vapor deposition process to produce the nanotubes.

The reactant gas is, for example, one of methane, carbon monoxide, carbon dioxide, acetylene, ethanol, acetone, hexane, aromatics, benzenes, ethers, glycols, toluene, xylene, propanol, pyridine, pentane, octane, carbon tetrachloride, butanol, butanone, acetonitrile, acetic acid, chloroform, alcohols, diglyme, dimethyl fluoride, methanol, methylene chloride, heptane, acetates, amines, dioxane, glycerine, glycols, boron trifluoride, boron bromide, boranes, dichloroethane, etc., or any combination thereof. The inert gas is, for example, one of argon, xenon, nitrogen, krypton, radon, neon, carbon dioxide, helium, etc., or any combination thereof.

In an embodiment, the chemical vapor deposition process and the physical vapor deposition process are continuous flow processes. That is, in the chemical vapor deposition process, the boron containing nanowire producing compound and the catalysts are injected or sprayed continuously in the quartz reactor with a mixture of a reactant gas and an inert gas flowing through the quartz reactor. In the physical vapor deposition process, the nanotube producing compound, the boron containing nanowire producing compound, and the catalysts are sprayed or injected continuously in the quartz reactor with an inert gas flowing through the quartz reactor. The continuous flow chemical vapor deposition process or the continuous flow physical vapor deposition process in the quartz reactor continuously produces boron filled hybrid nanotubes that are collected in a liquid, for example, water, forming a suspension. The boron filled hybrid nanotubes are collected in a liquid contained in a liquid container by continuously injecting the catalysts into the reaction process and having the exhaust of the quartz reactor pump directly into the liquid container. The liquid contained in the liquid container catches the produced boron filled hybrid nanotubes while allowing gases to bubble through the liquid and pass through freely. The collected boron filled hybrid nanotubes are spun on a spool and compressed to form a spooled bundle or a film.

In an embodiment, the boron filled hybrid nanotubes are purified and functionalized using acids, for example, hydrochloric acid, nitric acid, etc., or bases, for example, sodium hydroxide, potassium hydroxide, etc., or surfactants, for example, Triton™ X-100 of Sigma Aldrich® of Merck Group, poly [(m-phenylenevinylene)-alt-(p-phenylenevinylene)] (PmPv), or zinc protoporphyrin, etc., or any combination thereof. In an embodiment, the boron filled hybrid nanotubes are functionalized with a chemical side group. The chemical side group is, for example, one of a carboxyl group, an amine group, an ester linkage, a fullerene, an oxygen group, a radical group, dendrimers, diamines, nucleic acids, enzymes metal complexes, deoxyribonucleic acid, ribonucleic acid, poly m-phenylenevinylene-co-2,5-dioctoxy-p-phenlenevinylene, a vanadyl complex, glucose, proteins, a semiconductor, metal nanoparticles, etc., or any combination thereof. Functionalization allows the boron filled hybrid nanotubes to be chemically modified to enhance thermal properties and electrical properties while also allowing for improved utility when used in certain applications in a mechanical domain.

The boron filled hybrid nanotubes can be configured, for example, into composites, a nanopaper such as a buckypaper, etc., or can be agglomerated into bundles. Composites are materials obtained by mixing the boron filled hybrid nanotubes with matrix materials. The matrix materials bind fibers together and transfer loads and stresses with the composites. Examples of matrix materials mixed with the boron filled hybrid nanotubes to obtain composites are stainless steel, boron carbide ceramics, aluminum, tungsten, manganese, magnesium, tool steel, precious metals, copper, boron nitride ceramics, polymers such as polyethylene, etc. Composites possess enhanced mechanical properties, enhanced thermal properties, and enhanced electrical properties over constituent boron filled hybrid nanotubes. A nanopaper is a nanostructure configured in the form of a thin sheet made from an aggregate of the boron filled hybrid nanotubes. A nanopaper possesses enhanced mechanical properties and enhanced thermal properties in contrast to the constituent boron filled hybrid nanotubes and finds applications in macroscale, that is, in applications with a scale of more than 10 μm, for example, in electronics, mechanical applications, nuclear applications, chemical applications, etc. Boron filled hybrid nanotubes agglomerated into bundles also exhibit enhanced mechanical properties and find applications in macroscale.

Boron filled hybrid nanotubes are characterized to determine their structure and properties. The boron filled hybrid nanotubes are found to have diameters ranging, for example, from about 10 nm to about 1000 nm. For example, the method disclosed herein produces a boron filled hybrid nanotube with a diameter ranging, for example, from about 40 nm to about 60 nm. The length of each boron filled hybrid nanotube ranges, for example, from about 0.25 microns to about 1000 microns. In an embodiment, the length of each boron filled hybrid nanotube is about 0.5 microns to about 2 microns. The diameter of the interior boron based nanowire is about half that of the whole boron filled hybrid nanotube. The boron based nanowires form the core of the boron filled hybrid nanotube and increase the radial strength of the boron filled hybrid nanotube. Thus, the outer single walled nanotube and/or multi-walled nanotube provide better physical, thermal and chemical properties than nanotubes with hollow cores.

In an embodiment, the boron based nanowires in the boron filled hybrid nanotubes are free of pure boron. That is, the boron containing nanowire producing compound is a compound of boron and is not pure boron. The structure of the boron filled hybrid nanotubes is a straight structure, or a coiled structure, or a corrugated structure. The corrugated structure is a non-uniform or defective structure with furrows and ridges. The corrugated structure of the boron filled hybrid nanotubes allows mechanical loading to be transferred from an outer wall of the multi-walled nanotubes to the inner walls of the multi-walled nanotubes, and thereafter to the filled core of the boron filled hybrid nanotubes.

Figure 1B:
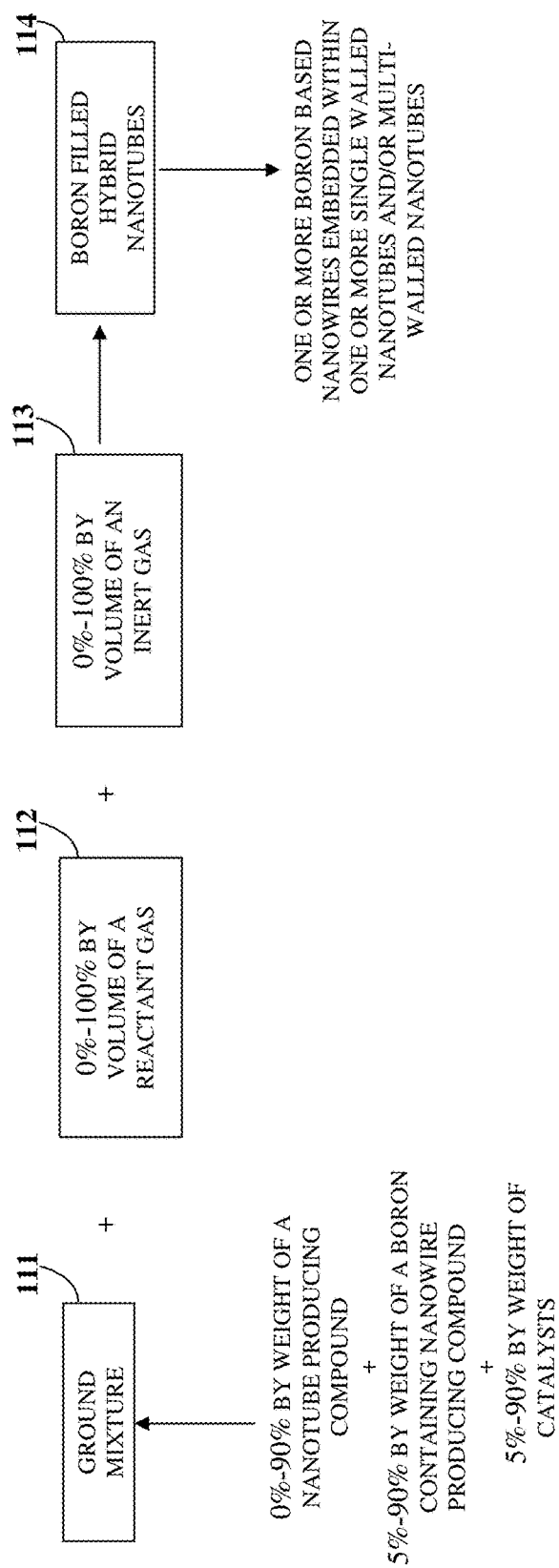
FIG. 1B exemplarily illustrates a block flow schematic representation of the method illustrated in FIG. 1A.

FIG. 1B exemplarily illustrates a block flow schematic representation of the method illustrated in FIG. 1A. A ground mixture 111 of about 0% to about 90% by weight of a nanotube producing compound, about 5% to about 90% by weight of a boron containing nanowire producing compound, and about 5% to about 90% by weight of catalysts is prepared. The ground mixture 111 is subjected to a vapor deposition process by passing about 0% to about 100% by volume of a reactant gas 112 and about 0% to about 100% by volume of an inert gas 113 over the ground mixture 111. In an example, in the absence of the nanotube producing compound in the ground mixture 111, that is, in the 0% by weight of the nanotube producing compound embodiment, the ground mixture 111 is subjected to about 10% by volume of the reactant gas 112 in the vapor deposition process. In another example, when the ground mixture 111 contains about 5% to about 90% by weight of the nanotube producing compound, the ground mixture 111 is subjected to a vapor deposition process by passing about 0% to about 100% by volume of an inert gas 113 over the ground mixture 111, without passing a reactant gas as a precursor for producing boron filled hybrid nanotubes 114. On subjecting the ground mixture 111 to the vapor deposition process, boron filled hybrid nanotubes 114 are produced containing one or more boron based nanowires embedded within one or more single walled nanotubes and/or multi-walled nanotubes.

Figure 2:
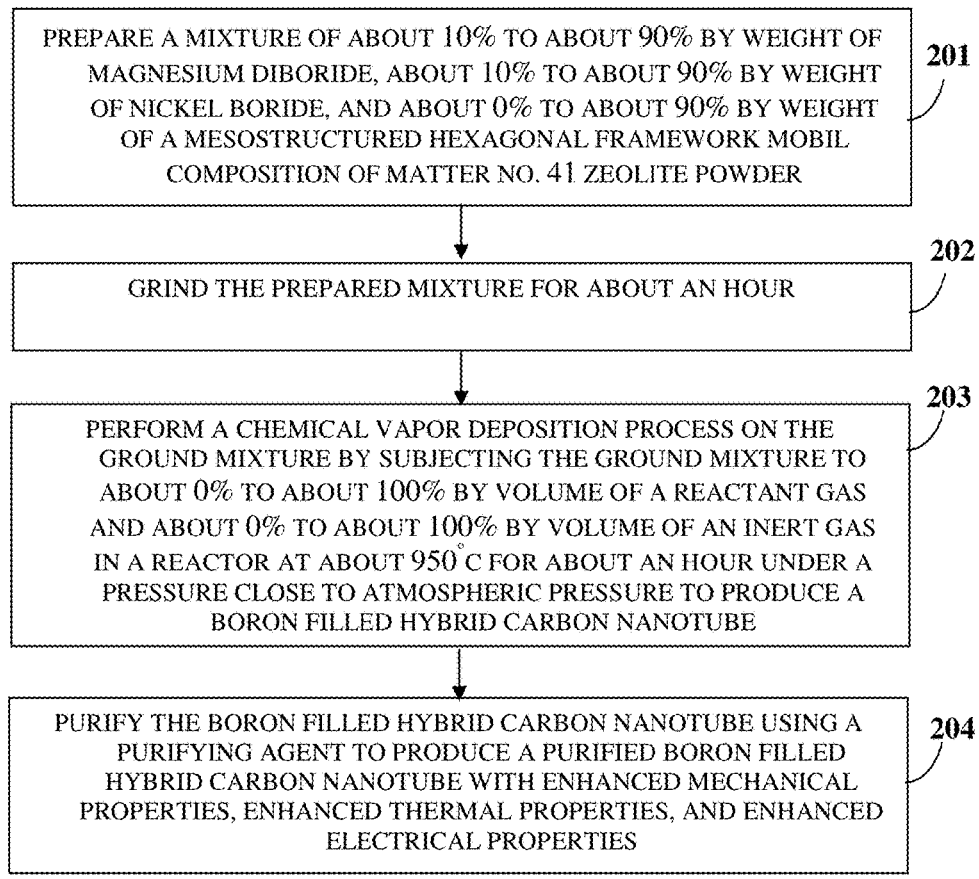
FIG. 2 exemplarily illustrates a method for producing purified boron filled hybrid carbon nanotubes comprising one or more boron based nanowires embedded within one or more single walled and/or one or more multi-walled carbon based nanotubes.

FIG. 2 exemplarily illustrates a method for producing purified boron filled hybrid carbon nanotubes comprising one or more boron based nanowires embedded within one or more single walled and/or multi-walled carbon based nanotubes. Schematic representations of boron filled hybrid nanotubes with a single walled nanotube and a multi-walled nanotube are exemplarily illustrated in FIGS. 4A-4E. As used herein, "carbon based nanotubes" refer to nanotubes composed predominantly of carbon. The method for producing boron filled hybrid carbon nanotubes is typically a solid-solid-gas reaction process in a reactor with an inert gas flowing through the reactor, making the method a chemical vapor deposition process. In the method disclosed herein, a mixture of about 10% to about 90% by weight of magnesium diboride, a boron containing nanowire producing compound, about 10% to about 90% by weight of nickel boride, a catalyst, and about 0% to about 90% by weight of a mesostructured hexagonal framework mobil composition of matter No. 41 zeolite powder, a substrate material, is prepared 201. For example, a mixture of about 50 wt % of magnesium diboride, about 30 wt % of nickel boride, and about 20 wt % of a mesostructured hexagonal framework mobil composition of matter No. 41 zeolite powder is prepared. The prepared mixture is ground 202 for a predetermined time period, for example, about an hour in a mixer, for example, an agate mortar and a rotary mixer, with grinding media. The chemical vapor deposition process is performed 203 on the ground mixture by subjecting the ground mixture to about 0% to about 100% by volume of a reactant gas and about 0% to about 100% by volume of an inert gas in a reactor at about 950° C. for about an hour under a pressure close to atmospheric pressure. Examples of the reactant gas and the inert gas are disclosed in the detailed description of FIG. 1A. When the mixture undergoes the solid-solid-gas reaction in the reactor, a boron filled hybrid carbon nanotube comprising one or more boron based nanowires embedded within one or more single walled and/or multi-walled carbon based nanotubes is produced. The produced boron filled hybrid carbon nanotube is purified 204 using a purifying agent to produce a purified boron filled hybrid carbon nanotube with enhanced mechanical properties, enhanced thermal properties, and enhanced electrical properties. The produced boron filled hybrid carbon nanotube is cooled to room temperature under a flow of an inert gas through the reactor.

In an embodiment, magnesium diboride ($MgB_2$), a chemical from Alfa Aesar® of Johnson Matthey Public Limited Company, and nano-nickel boride (NiB) act as solid boron precursors and/or catalysts for producing boron based nanowires. A mesostructured hexagonal framework mobil composition of matter-41 (MCM-41) zeolite powder from Sigma Aldrich® of Merck Group is used as a catalyst in the reaction. In an embodiment, $MgB_2$ in the prepared mixture is the boron containing nanowire producing compound, NiB is the catalyst for the chemical vapor deposition process, and the mesostructured hexagonal framework MCM-41 zeolite powder is the substrate material that provides a template for the growth of the nanotube and the boron based nanowires.

Consider an example where a mixture of about 50% by weight of $MgB_2$, about 30% by weight of NiB, and about 20% by weight of a mesostructured hexagonal framework mobil composition of matter-41 (MCM-41) zeolite powder is prepared. The boron precursors and the catalysts are mixed and reduced in particle size to a powder by grinding using a mortar and pestle. About 0.02 grams to about 0.1 grams of the mixture are added and ground in an agate mortar for about an hour to ensure that the boron precursors and the catalysts are well mixed. The mixture is ground further for several hours in a rotary mixer. The rotary mixer uses cylindrical ceramic pieces as grinding media. The ground mixture is loaded into a quartz reactor for the chemical vapor deposition process as disclosed in the detailed description of FIG. 3. The pressure in the quartz reactor is evacuated to about $10^{-3}$ torr and the mixture is heated to 950° C. at a rate of 10° C. per minute for about an hour. About 90.9% by volume of an inert gas, for example, argon, xenon, nitrogen, krypton, radon, neon, carbon dioxide, or helium, and about 9.1% by volume of a reactant gas, for example, methane, carbon monoxide, carbon dioxide, acetylene, ethanol, acetone, hexane, aromatics, benzenes, ethers, glycols, etc., are passed through the mixture in the quartz reactor. The flow rate of the inert gas through the quartz reactor is, for example, about 100 standard cubic centimeters per minute (sccm). The reactant gas is typically a carbon containing gas, for example, acetylene, methane, carbon monoxide, etc., and acts as a source of carbon for the production of carbon based nanotubes. In an embodiment, a boron containing gas, for example, borane, pure boron, etc., is used to provide boron for the boron based nanowires. The flow rate of the reactant gas is, for example, about 10 sccm.

After the mixture is maintained in a furnace in the quartz reactor at about 950° C. for about an hour, the furnace is switched off and the quartz reactor is cooled to room temperature under an inert gas, for example, argon flowing through the quartz reactor. In an embodiment, about 0% to about 90% by weight of a substrate material, for example, porous silicon is added to the mixture of boron precursors and catalysts prior to heating the furnace to about 950° C. For example, 30% by weight of porous silicon is added to the mixture of boron precursors and catalysts prior to heating the furnace to about 950° C. Under predetermined operating conditions, a boron filled hybrid carbon nanotube comprising one or more boron based nanowires embedded within one or more single walled carbon based nanotubes and/or one or more multi-walled carbon based nanotubes is produced. The temperature and time are configurable and varying the temperature and time results in similar but different compositions and/or morphologies of the boron filled hybrid carbon nanotube. Subsequently, the boron filled hybrid carbon nanotube is purified using a purifying agent, for example, a combination of acids such as nitric acid, hydrochloric acid, etc., and bases such as sodium hydroxide to functionalize the boron filled hybrid carbon nanotube. In an embodiment, about 0% to about 20% by weight of surfactants, for example, Triton™ X-100 from Sigma Aldrich® of Merck Group, poly [(m-phenylenevinylene)-alt-(p-phenylenevinylene)] (PmPv), zinc protoporphyrin (ZPP), etc., are used as purifying agents to purify and functionalize the boron filled hybrid carbon nanotube. In an example, about 0% to about 1% by weight of PmPv is used as the purifying agent to purify and functionalize the boron filled hybrid carbon nanotube. In an embodiment, the chemical vapor deposition process is a continuous flow process. The chemical vapor deposition process continuously produces boron filled hybrid carbon nanotubes that are collected in a liquid, for example, water, forming a suspension. The collected boron filled hybrid carbon nanotubes are spun on a spool and compressed to form a spooled bundle or a film.

The purified boron filled hybrid carbon nanotube can be configured into a composite, a nanopaper, one or more bundles, a spooled bundle, a film, etc., with enhanced mechanical, thermal and electrical properties. For enhanced chemical properties, the purified boron filled hybrid carbon nanotube is functionalized with a chemical side group. Examples of the chemical side group for functionalization of the purified boron filled hybrid carbon nanotube are disclosed in the detailed description of FIG. 1A. In an embodiment, the purified boron filled hybrid carbon nanotube is configured to possess a straight structure, a coiled structure, or a corrugated structure. In an embodiment, the corrugated structure of the boron filled hybrid carbon nanotube is substantially doped with boron from the boron based nanowires for providing insulation in applications such as energy storage, electrical shielding, etc. The corrugated structure in the purified boron filled hybrid carbon nanotube results from the presence of substantial boron in an outer wall of the purified boron filled hybrid carbon nanotube and a templating effect with the boron based nanowires, where a mismatch between the structures of the carbon based nanotube and the boron based nanowires causes a disruption in the structure of the purified boron filled hybrid carbon nanotube. The corrugated or defective structure of the purified boron filled hybrid carbon nanotube makes the purified boron filled hybrid carbon nanotube capable of facile functionalization and easy bonding to matrices in composites, and in an embodiment, provides enhanced strength in an axial direction when compared to conventional carbon nanotubes. The enhanced strength in the axial direction is possible because the purified boron filled hybrid carbon nanotube has an enhanced load distribution compared to a conventional carbon nanotube because of the corrugated structure of the outer wall of the purified boron filled hybrid carbon nanotube.

The filled core of the boron filled hybrid carbon nanotube comprising the boron based nanowires improves compressive and radial mechanical properties of the boron filled hybrid carbon nanotube. Furthermore, the corrugated, highly defective structure allows the boron filled hybrid carbon nanotube to have a greater ability to bond to adjacent nanotubes and enhanced adhesion to matrix materials in composites. The corrugated structure improves wall-to-wall adhesion on the inside of the boron filled hybrid carbon nanotube, and helps to facilitate the improvement in mechanical properties. The corrugated structure allows loading to be transferred from the outer wall of the boron filled hybrid carbon nanotube to the inner wall of the boron filled hybrid carbon nanotube and the presence of defects improves bonding between the outer wall and the inner wall.

For purposes of illustration, the detailed description herein refers to production of a boron filled hybrid carbon nanotube comprising one or more boron based nanowires embedded within one or more carbon based nanotubes; however the scope of the method disclosed herein is not limited to production of a boron filled hybrid carbon nanotube but may be extended to include production of a boron filled hybrid nanotube comprising one or more boron based nanowires embedded within one or more nanotubes produced from other compounds, for example, boron nitride, boron carbon nitride, titania, zinc oxide, tungsten sulfide, halogenide, silicon, chalcogenide, carbon organic materials, etc., or any combination thereof.

Figure 3:
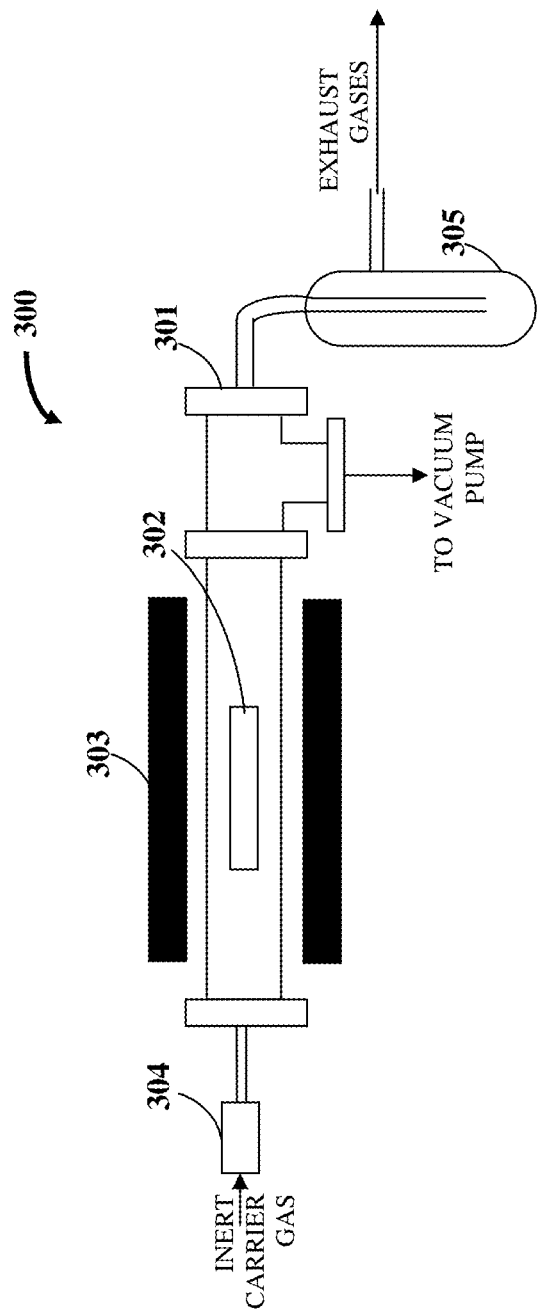
FIG. 3 exemplarily illustrates a schematic representation of a chemical vapor deposition system used for producing boron filled hybrid nanotubes.

FIG. 3 exemplarily illustrates a schematic representation of a chemical vapor deposition system 300 used for producing boron filled hybrid nanotubes. A chemical vapor deposition process is a solid-solid-gas reaction performed at high temperatures in a furnace 303 with an inert gas flowing continuously through a reactor 301. In the chemical vapor deposition process, a substrate, for example, porous silicon, an aerogel, is exposed to one or more volatile precursors that react and/or decompose on a surface of the substrate to produce a desired deposit. That is, in producing boron filled hybrid nanotubes, the substrate acts as a template for the nanotube and the boron based nanowire to grow. The substrate is formed from the substrate material, for example, porous silicon, added to the reactor 301 and also from remains of catalyst particles present after the chemical vapor deposition reaction. The volatile precursors in the chemical vapor deposition system 300 originate from the original catalysts, any solid precursors, for example, solid precursors of the boron based nanowire, and the reactant gas. Chemical vapor deposition processes are scalable and are flexible in terms of processing input parameters, for example, reaction temperature, reactant gas flow, etc. Chemical vapor deposition processes are capable of creating numerous nanostructures.

As exemplarily illustrated in FIG. 3, the chemical vapor deposition system 300 comprises a quartz reactor 301, a sample holder 302, a furnace 303, a flow controller 304, and a bubbler 305. The chemical vapor deposition process occurs in the quartz reactor 301. The quartz reactor 301 is equipped with the sample holder 302 that holds a mixture of reacting compounds, catalysts, and substrate materials. The boron containing nanowire producing compounds and the catalysts are mixed together in a pre-formulated proportion to prepare a mixture and the mixture is ground in a mortar and pestle and in a rotary mixer with grinding media. The ground mixture is loaded into the sample holder 302 and placed in the quartz reactor 301. Flow of an inert carrier gas over the mixture in the sample holder 302 is initiated in the quartz reactor 301. The inert carrier gas is a mixture of the inert gas and the reactant gas. The reactant gas, for example, methane, is the precursor for producing the nanotube. The flow rate of the inert carrier gas is controlled using the flow controller 304. The bubbler 305 is used with the quartz reactor 301 to capture exhaust gases produced by the reaction in the quartz reactor 301 for environmental or health purposes and to visually indicate flow of the exhaust gases from the quartz reactor 301. The boron containing nanowire producing compounds along with the reactant gas contained in the inert carrier gas break down and react in the quartz reactor 301 to form the boron filled hybrid nanotubes. The pressure in the quartz reactor 301 is maintained at, for example, about 0 bar to about 300 bar using a vacuum pump (not shown). The mixture is heated to temperatures, for example, about 500° C. to about 1500° C. in the quartz reactor 301 using the furnace 303 whose temperature is maintained using a temperature controller (not shown). On undergoing a chemical vapor deposition reaction, nanotube layers are deposited on the boron based nanowires. The chemical vapor deposition process produces boron filled hybrid nanotubes comprising one or more boron based nanowires embedded within one or more single walled nanotubes and/or multi-walled nanotubes as disclosed in the detailed description of FIGS. 1A-2. The boron based nanowires are produced from and/or contain the boron containing nanowire producing compound disclosed in the detailed description of FIG. 1A. The single walled and/or multi-walled nanotubes are produced from and/or contain the nanotube producing compound disclosed in the detailed description of FIG. 1A. In an embodiment, the chemical vapor deposition process is a continuous flow process. That is, in the chemical vapor deposition process, the boron containing nanowire producing compound and the catalysts are injected or sprayed continuously in the quartz reactor 301 with the inert carrier flowing in the quartz reactor 301 to continuously produce boron filled hybrid nanotubes that are collected in a liquid, for example, water, forming a suspension. The collected boron filled hybrid nanotubes are spun on a spool and compressed to form a spooled bundle or a film.

Figure 4A:
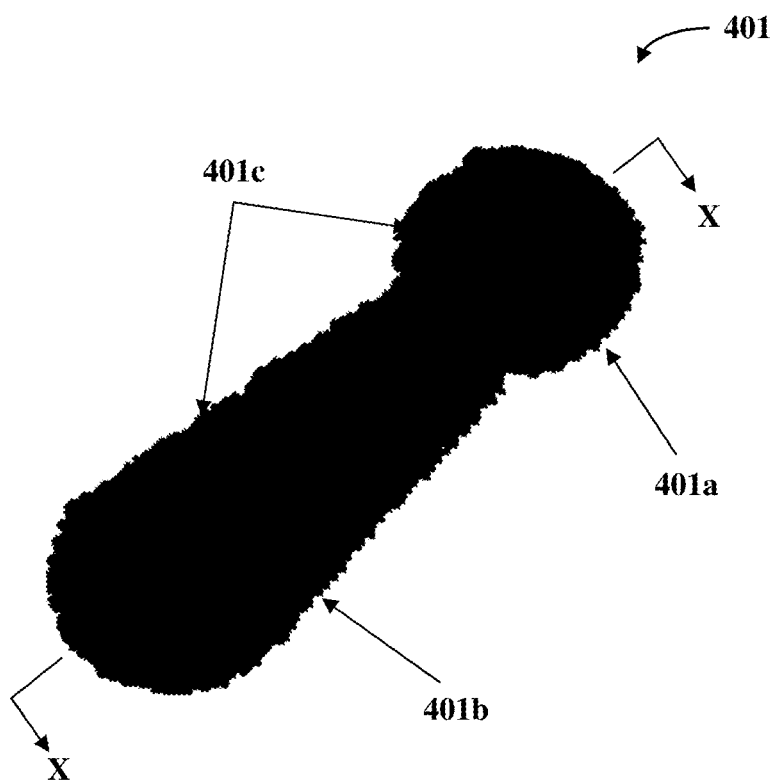
FIG. 4A exemplarily illustrates a schematic representation of a corrugated boron filled hybrid carbon nanotube.

FIG. 4A exemplarily illustrates a schematic representation of a corrugated boron filled hybrid carbon nanotube 401. The corrugated boron filled hybrid carbon nanotube 401 comprises a head 401a and a body 401b. The outer walls 401c of the corrugated boron filled hybrid carbon nanotube 401 are also exemplarily illustrated in FIG. 4A.

Figure 4B:
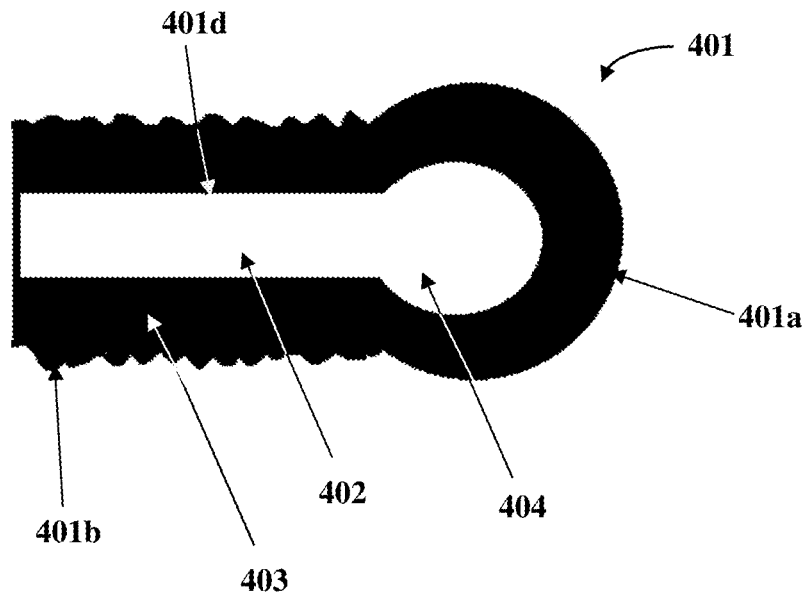
FIG. 4B exemplarily illustrates a sectional view of the corrugated boron filled hybrid carbon nanotube taken along a section X-X in FIG. 4A.

FIG. 4B exemplarily illustrates a sectional view of the corrugated boron filled hybrid carbon nanotube 401 taken along a section X-X in FIG. 4A. As exemplarily illustrated in FIG. 4B, the body 401b of the corrugated boron filled hybrid carbon nanotube 401 comprises a boron based nanowire 402 embedded within a carbon based nanotube 403. In an embodiment, the carbon based nanotube 403 is single walled as exemplarily illustrated in FIG. 4B. The corrugated boron filled hybrid carbon nanotube 401 exemplarily illustrated in FIG. 4B, contains a catalyst 404, for example, pure boron or a compound of boron in the head 401a of the corrugated boron filled hybrid carbon nanotube 401. The boron based nanowire 402 is produced from a boron containing nanowire producing compound, for example, magnesium diboride or nickel boride or any of the boron containing nanowire producing compounds disclosed in the detailed description of FIG. 1A. The carbon based nanotube 403 is produced from a carbon based reactant gas, for example, methane. In an embodiment, the carbon based nanotube 403 is produced from any of the nanotube producing compounds disclosed in the detailed description of FIG. 1A.

Figure 4C:
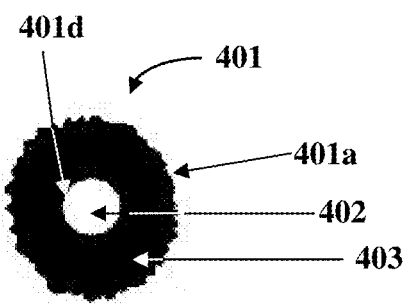
FIG. 4C exemplarily illustrates a front elevation view of the corrugated boron filled hybrid carbon nanotube.

FIG. 4C exemplarily illustrates a front elevation view of the corrugated boron filled hybrid carbon nanotube 401, showing a boron based nanowire 402 embedded within the carbon based nanotube 403. In an embodiment, the corrugated boron filled hybrid carbon nanotube 401 of FIG. 4A is comprised of a multi-walled carbon based nanotube 405 exemplarily illustrated in FIGS. 4D-4E.

Figure 4D:
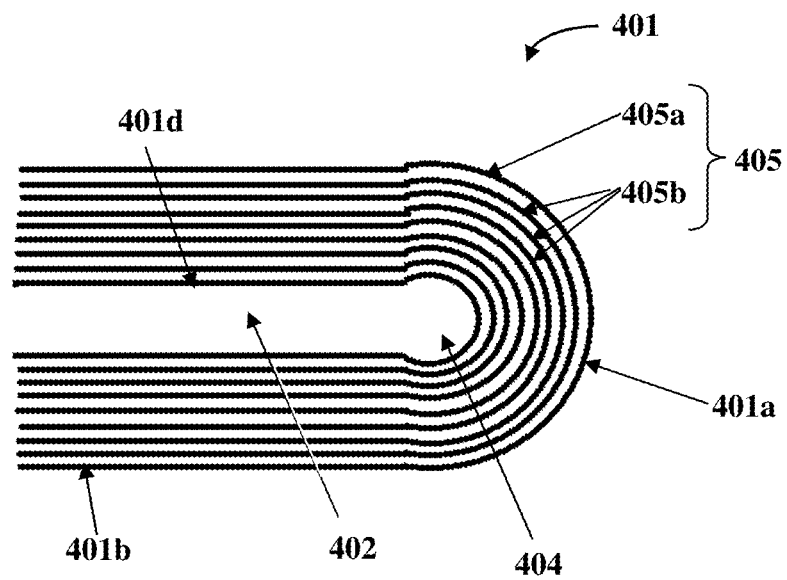
FIG. 4D exemplarily illustrates a sectional view of an embodiment of the corrugated boron filled hybrid carbon nanotube with a multi-walled carbon based nanotube, taken along the section X-X in FIG. 4A.

FIG. 4D exemplarily illustrates a sectional view of an embodiment of the corrugated boron filled hybrid carbon nanotube 401 with a multi-walled carbon based nanotube 405, taken along the section X-X in FIG. 4A. In this embodiment, the carbon based nanotube 405 is multi-walled comprising an outer wall 405a and inner walls 405b as exemplarily illustrated in FIG. 4D. As exemplarily illustrated in FIG. 4D, the body 401b of the corrugated boron filled hybrid carbon nanotube 401 comprises a boron based nanowire 402 embedded within the multi-walled carbon based nanotube 405. The corrugated boron filled hybrid carbon nanotube 401 contains a catalyst 404 in the head 401a.

Figure 4E:
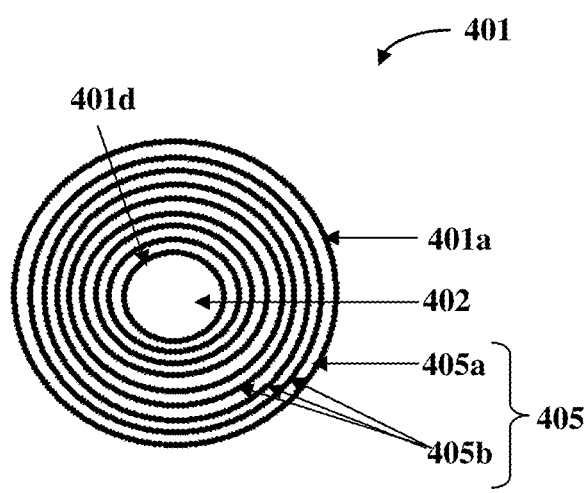
FIG. 4E exemplarily illustrates a front elevation view of the embodiment of the corrugated boron filled hybrid carbon nanotube with a multi-walled carbon based nanotube.

FIG. 4E exemplarily illustrates a front elevation view of the embodiment of the corrugated boron filled hybrid carbon nanotube 401 shown in FIG. 4D, with a multi-walled carbon based nanotube 405. As exemplarily illustrated in FIG. 4E, a boron based nanowire 402 is embedded within the multi-walled carbon based nanotube 405.

The outer carbon based nanotube 403 grown around the boron based nanowire 402 in the boron filled hybrid carbon nanotube 401 exemplarily illustrated in FIGS. 4A-4C, produced using the method disclosed in the detailed description of FIG. 2, possesses a corrugated structure that allows mechanical loading to be transferred more effectively from the outer wall 401c of the boron filled hybrid carbon nanotube 401 exemplarily illustrated in FIG. 4A, to a boron filled core 401d of the boron filled hybrid carbon nanotube 401 exemplarily illustrated in FIGS. 4B-4C. The outer carbon based nanotube 405 grown around the boron based nanowire 402 in the embodiment of the boron filled hybrid carbon nanotube 401 exemplarily illustrated in FIGS. 4D-4E, produced using the method disclosed in the detailed description of FIG. 2, possesses a corrugated structure as exemplarily illustrated in FIG. 4A, which allows mechanical loading to be transferred more effectively from the outer wall 405a of the boron filled hybrid carbon nanotube 401 to the inner walls 405b of the boron filled hybrid carbon nanotube 401, and thereafter to a boron filled core 401d of the boron filled hybrid carbon nanotube 401 exemplarily illustrated in FIGS. 4D-4E. The corrugated structure of the carbon based nanotube 403 or 405 also allows for interlocking to occur between adjacent nanotubes, making the boron filled hybrid carbon nanotube 401 stronger when used, for example, in bundles, as a nanopaper, etc. The corrugated outer carbon based nanotube 403 or 405 possesses heavy doping of boron from the interior boron based nanowire 402. For example, the boron to carbon ratio in the outer carbon based nanotube layers is about 1:9. With a corrugated structure, the boron filled hybrid carbon nanotube 401 is found to be insulating. The corrugation of the outer carbon based nanotube 403 or 405 results from a templating effect with the boron based nanowire 402 and the presence of greater amounts of boron in the outer carbon based nanotube 403 or 405 of the boron filled hybrid carbon nanotube 401.

The corrugated structure of the outer carbon based nanotube 403 or 405 makes the boron filled hybrid carbon nanotube 401 capable of facile functionalization, facile bonding to matrices in composites, and enhanced strength in an axial direction in comparison to conventional carbon nanotubes. The enhanced strength of the boron filled hybrid carbon nanotube 401 in the axial direction is possible because the boron filled hybrid carbon nanotube 401 has enhanced load distribution compared to a conventional carbon nanotube due to the corrugated structure of the walls of the outer carbon based nanotube 403 or 405 of the boron filled hybrid carbon nanotube 401. A filled core, for example, the boron filled core 401d comprising the boron based nanowire 402 enhances the strength of the corrugated outer carbon based nanotube 403 or 405 in the boron filled hybrid carbon nanotube 401.

Figure 5:
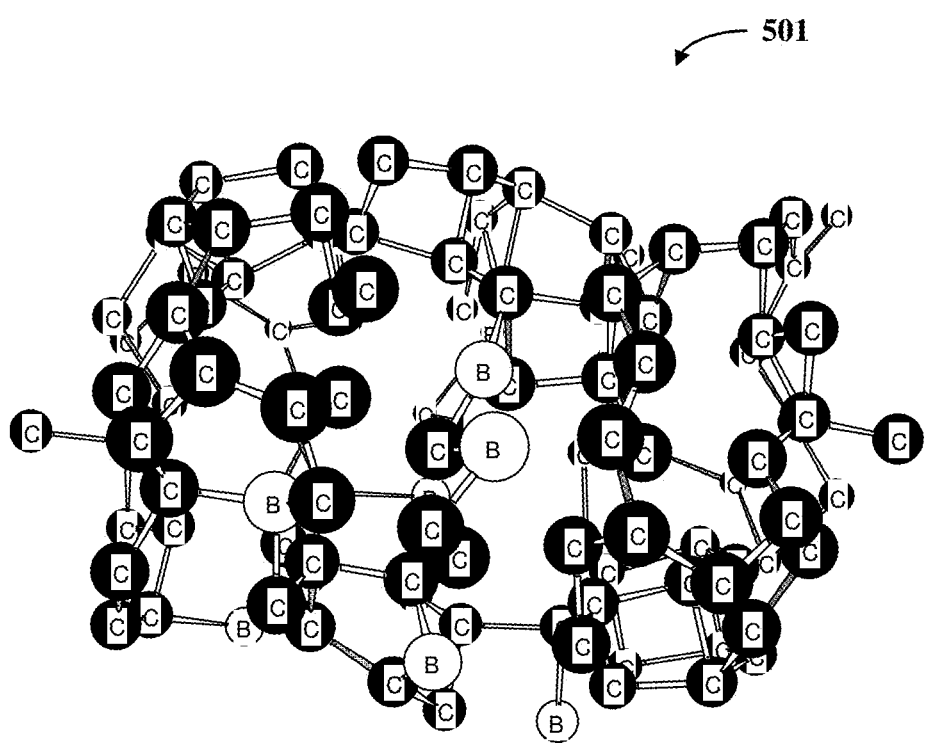
FIG. 5 exemplarily illustrates a schematic representation of an outer shell of a boron filled hybrid carbon nanotube.

FIG. 5 exemplarily illustrates a schematic representation of an outer shell 501 of a boron filled hybrid carbon nanotube 401 exemplarily illustrated in FIGS. 4A-4E. The outer shell 501 of the boron filled hybrid carbon nanotube 401 is formed by one or more single walled carbon based nanotubes 403 or multi-walled carbon based nanotubes 405 exemplarily illustrated in FIGS. 4B-4E. The outer shell 501 of the boron filled hybrid carbon nanotube 401 is corrugated and substantially doped with boron from the interior boron based nanowire 402 exemplarily illustrated in FIGS. 4B-4E. The boron to carbon ratio in the outer shell 501 is, for example, about 1:9.

The properties exhibited by the boron filled hybrid nanotubes are qualitatively characterized by electron microscopy. Electron microscopes use a beam of accelerated electrons as a source of illumination instead of light as in the case of a light microscope. Electron microscopes have a high resolution and magnification and allow viewing nanostructures in finer detail. Examples of electron microscopes used for characterization of boron filled hybrid nanotubes are a scanning electron microscope (SEM), a transmission electron microscope (TEM), a scanning transmission electron microscope (STEM), etc. SEM examination provides an overview of the nanostructure, that is, the boron filled hybrid nanotube while an accurate examination by the TEM identifies defects in the boron filled hybrid nanotube and provides information on atomic spacings or crystallographic spacings.

The scanning electron microscope (SEM) operates based on raster scanning of a surface of a nanostructure, that is, a boron filled hybrid nanotube, with a narrow beam of electrons. In raster scanning, an electron beam is swept across the surface of the boron filled hybrid nanotube one row at a time from top to bottom. When the electron beam moves across each row of the surface of the boron filled hybrid nanotube, the electron beam is scattered from the surface of the boron filled hybrid nanotube, and intensity of the scattered electron beam is switched on and off to create a pattern of illuminated spots. The incident electron beam stimulates radiation from the boron filled hybrid nanotube. The radiation from the boron filled hybrid nanotube is detected, amplified, and used to modulate the brightness of a second beam of electrons scanned synchronously with the first beam across a cathode ray tube display. The surface of the boron filled hybrid nanotube possesses a small amount of electrical conductivity that allows the electrons to flow. As the electron beam raster-scans the surface of the boron filled hybrid nanotube, scattered electrons and x-rays are generated which identify morphological and chemical information about the boron filled hybrid nanotube. Currently, the resolution of an SEM approaches, for example, about 0.5 nm and is used to provide morphological information of the boron filled hybrid nanotube, at nanoscale resolution. SEM images are obtained with an in-lens detector. The in-lens detector provides the highest two-dimensional resolution of the boron filled hybrid nanotube, but some of the topographic information is lost.

In the transmission electron microscope (TEM), a beam of electrons travels through a vacuum in a column of the TEM and is transmitted through an ultra-thin sample specimen, that is, the boron filled hybrid nanotube where the boron filled hybrid nanotube and the beam of electrons interact to generate an image. After the electron beam interacts with the boron filled hybrid nanotube, different lenses based on electromagnets are used to alter a focal plane to be imaged. The electron beam is then directed to a charge coupled device (CCD) detector attached to an yttrium aluminum garnet screen coupled to a computer for image and related data analysis. A high resolution TEM produces images of a spatial resolution down to about 0.1 nm, which is near the length scale of atoms, while also providing structural information and elemental compositions of the boron filled hybrid nanotube at nanoscale. The scanning electron microscope (SEM) is used to screen the boron filled hybrid nanotube, which is then examined further at a higher resolution and with electron diffraction using the TEM.

Figure 6A:
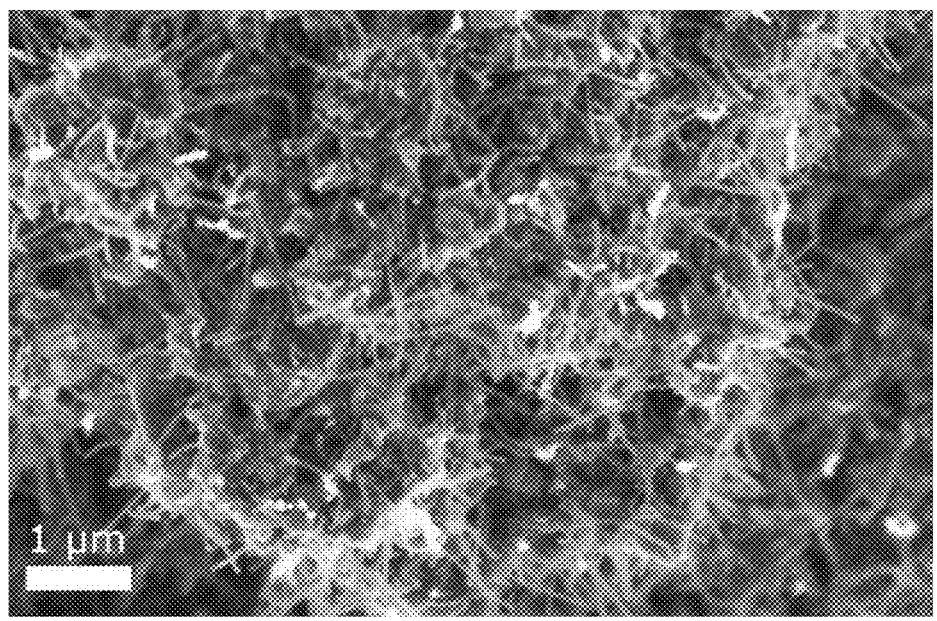
FIG. 6A exemplarily illustrates a scanning electron microscopy image of boron filled hybrid carbon nanotubes protruding from a surface of a particle.

FIG. 6A exemplarily illustrates a scanning electron microscopy (SEM) image of boron filled hybrid carbon nanotubes protruding from a surface of a particle. The particle in the SEM image is a mixture of a catalyst and some of the solid-solid-gas reaction byproducts of the chemical vapor deposition process. SEM imaging is conducted on a sample of the boron filled hybrid carbon nanotubes produced using the method disclosed in the detailed description of FIG. 2, implemented using the chemical vapor deposition system 300 exemplarily illustrated in FIG. 3. SEM analysis shows that the sample comprises boron filled hybrid carbon nanotubes of, for example, about 40 nm to about 60 nm in diameter and several microns in length. The sample is found to predominantly consist of boron filled hybrid carbon nanotubes. After the SEM analysis of the sample, the sample is analyzed under the transmission electron microscope (TEM).

Figure 6B:
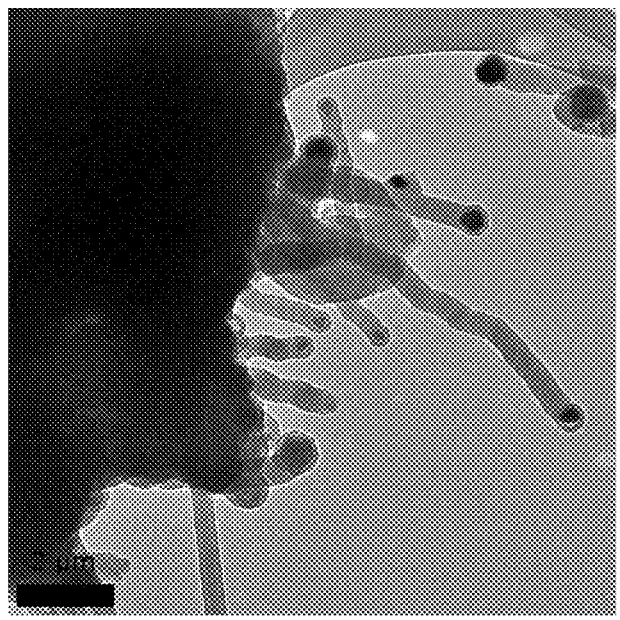
FIG. 6B exemplarily illustrates a transmission electron microscopy image of boron filled hybrid carbon nanotubes.

FIG. 6B exemplarily illustrates a transmission electron microscopy (TEM) image of boron filled hybrid carbon nanotubes. The TEM image is a low magnification image of the boron filled hybrid nanotubes that shows the boron filled hybrid carbon nanotubes are not completely straight and have a bulbous tip from the catalyst. The TEM analysis of the sample of boron filled hybrid carbon nanotubes provides more information on the structure of the boron filled hybrid carbon nanotubes. The TEM analysis confirms the results of scanning electron microscopy (SEM) exemplarily illustrated in FIG. 6A. The TEM image also shows that the boron filled hybrid carbon nanotubes are corrugated, have numerous bends, and grow out of large particles with catalysts in the heads of the boron filled hybrid carbon nanotubes. The large particles comprise the catalysts mixed with the solid reaction byproducts of the chemical vapor deposition process.

Figure 7A:
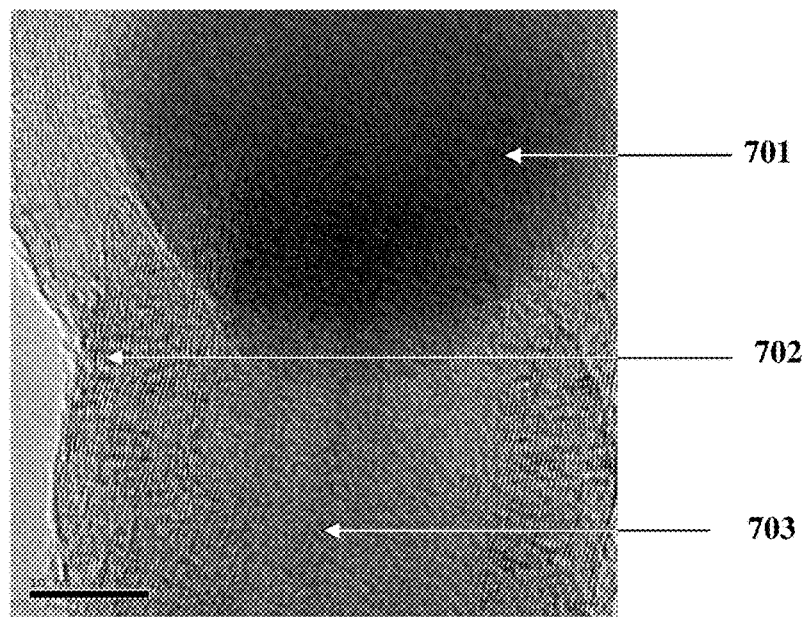
FIG. 7A exemplarily illustrates a transmission electron microscopy image of a catalyst particle in a boron filled hybrid carbon nanotube.

FIG. 7A exemplarily illustrates a transmission electron microscopy (TEM) image of a catalyst particle in a boron filled hybrid carbon nanotube. The high magnification TEM image exemplarily illustrated in FIG. 7A, shows that the boron filled hybrid carbon nanotube is constituted by two materials joined intimately together forming a core shell, radial heterostructure. The outer part of the boron filled hybrid carbon nanotube, including the area curled around the catalyst 701, appears to be a layered, corrugated structure 702. The crystalline structure 703 extending from under the catalyst 701 forms the interior boron based nanowire. The outer multi-walled carbon nanotube of the boron filled hybrid carbon nanotube appears to be of a different structure than the interior boron based nanowire exemplarily illustrated in FIG. 7A. The outer part of the boron filled hybrid carbon nanotube encapsulates the catalyst 701.

Figure 7B:
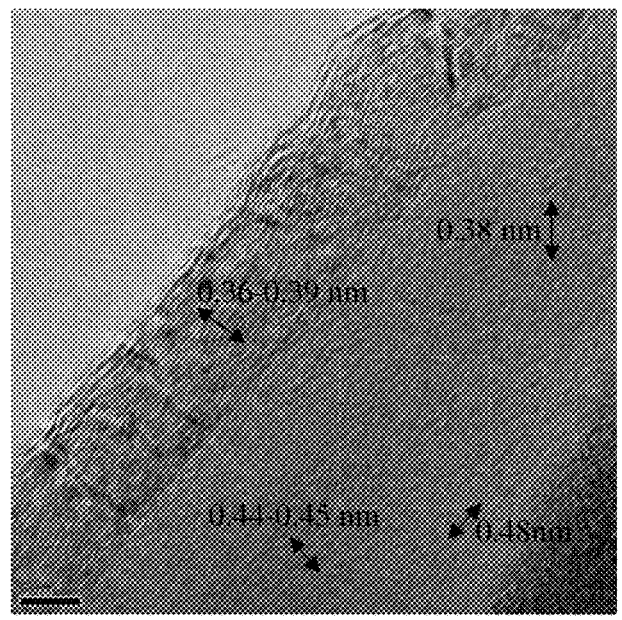
FIG. 7B exemplarily illustrates a transmission electron microscopy image of a boron filled hybrid carbon nanotube with labeled crystallographic spacings.

FIG. 7B exemplarily illustrates a transmission electron microscopy (TEM) image of a boron filled hybrid carbon nanotube with labeled crystallographic spacings. The arrows exemplarily illustrated in FIG. 7B, indicate directions of the crystallographic spacings. TEM image analysis shows an interlayer spacing between layers of the outer part of the boron filled hybrid carbon nanotube. The interlayer spacing ranges, for example, from about 0.36 nm to about 0.39 nm as confirmed using fast Fourier transform (FFT) analysis. FFT is used to measure distances between atomic planes in a high resolution TEM image. The exact interlayer spacing is difficult to determine because the interlayer spacing itself varies due to the uneven nature of the layers. Using the fast Fourier transform (FFT) analysis, the spacings of the internal boron based nanowires are found to be, for example, about 0.48 nm, 0.38 nm, and 0.43 nm, with angles of about 46.9°, 77.7°, and 54.6°.

Figure 8A:
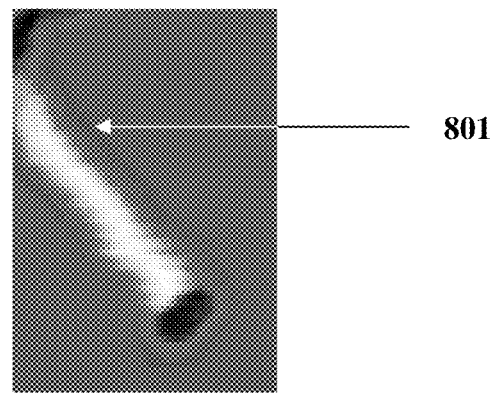
FIGS. 8A-8B exemplarily illustrate boron and carbon electron energy loss spectroscopy maps.
Figure 8B:
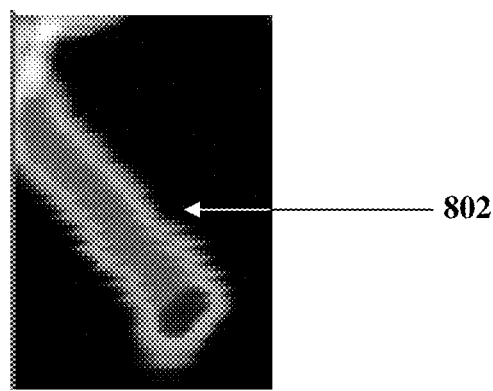

FIGS. 8A-8B exemplarily illustrate boron and carbon electron energy loss spectroscopy (EELS) maps of a boron filled hybrid carbon nanotube. As used herein, "electron energy loss spectroscopy (EELS)" refers to an analytical technique performed in transmission electron microscopes (TEMs) equipped with spectrometers. When a beam of electrons is transmitted through a sample, for example, a nanostructure such as a boron filled hybrid carbon nanotube, electron energy loss occurs and a spectrum obtained is used to extract an atomic composition, details about chemical bonding, valence and conduction band electronic properties, surface properties, and element-specific pair distance distribution functions of the nanostructure. EELS has a spectral resolution of about 1 electron volt (eV) or better. EELS analysis in a scanning transmission electron microscopy (STEM) mode shows the elemental composition and distribution in the boron filled hybrid carbon nanotube. The inside and outside of the boron filled hybrid carbon nanotube is found to consist of boron 801 and carbon 802, respectively. Some boron is also found in the exterior nanotube, for example, in a boron:carbon ratio of about 1:9. Small amounts of other elements, for example, oxygen, magnesium, nickel, and nitrogen, in amounts, for example, below 1% by volume may also be present in the exterior nanotube. Along with the information from the bright field TEM imaging, the results of the EELS analysis show that the boron filled hybrid carbon nanotube produced in the method disclosed in the detailed description of FIG. 2, is a boron based nanowire covered in layers of carbon and the outer part of the boron filled hybrid carbon nanotube encapsulates the catalyst. The boron filled hybrid carbon nanotube comprises the boron based nanowire encased in a single walled or multi-walled carbon nanotube.

A Raman spectroscopy analysis is conducted to examine the structure of the outer multi-walled nanotube of carbon that is on the outside of the boron filled hybrid carbon nanotube produced in the method disclosed in the detailed description of FIG. 2. Raman spectroscopy analysis refers to a spectroscopy analysis of Raman scattering occurring when light interacts with the nanostructure, that is, the boron filled hybrid carbon nanotube. When light interacts with fine matter, for example, a nanostructure like boron filled hybrid carbon nanotube, the light is either absorbed or scattered. During the scattering process, the majority of the light is scattered elastically with no energy transfer between the light and the fine matter. The elastic scattering is a high probability event, which is referred to as Rayleigh scattering. However, when the oscillating electric field of the incoming radiation interacts with the fine matter, there is also a small, but finite probability of inelastic scattering as a result of the generation of vibrational excitations in the fine matter. The inelastic scattering is a low probability event, which is typically six orders of magnitude weaker than Rayleigh scattering, and is referred to as Raman scattering. Raman scattering spectroscopy is carried out using a laser of a known wavelength, in conjunction with a holographic grating spectrometer, a notch or edge filter to eliminate a Rayleigh scattering wing, and a charge coupled device (CCD) detector coupled to a computer for detection of weak light signals. Raman scattering spectroscopy is used to characterize vibrational frequencies of the nanostructure, that is, the boron filled hybrid carbon nanotube.

Figure 9A:
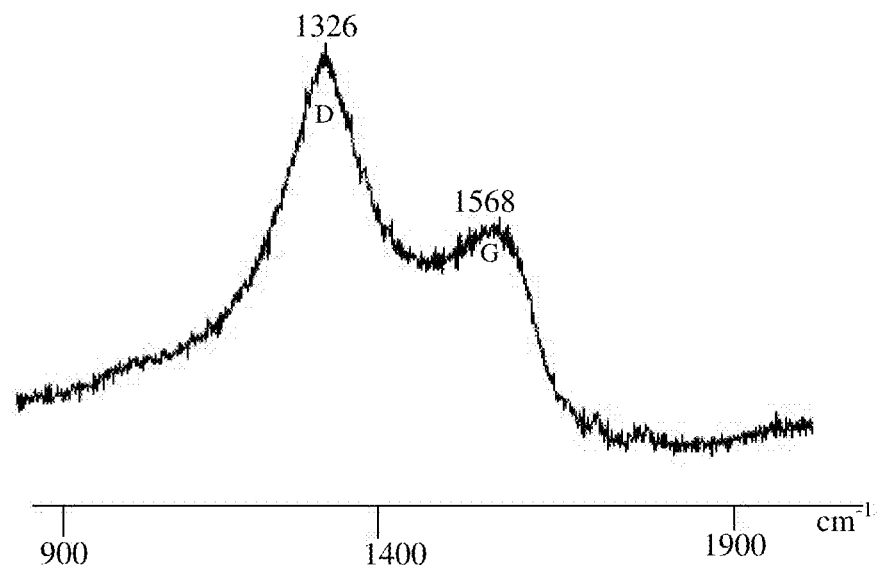
FIGS. 9A-9B exemplarily illustrate graphical representations of spectrums obtained from Raman spectroscopy performed on a boron filled hybrid carbon nanotube.
Figure 9B:
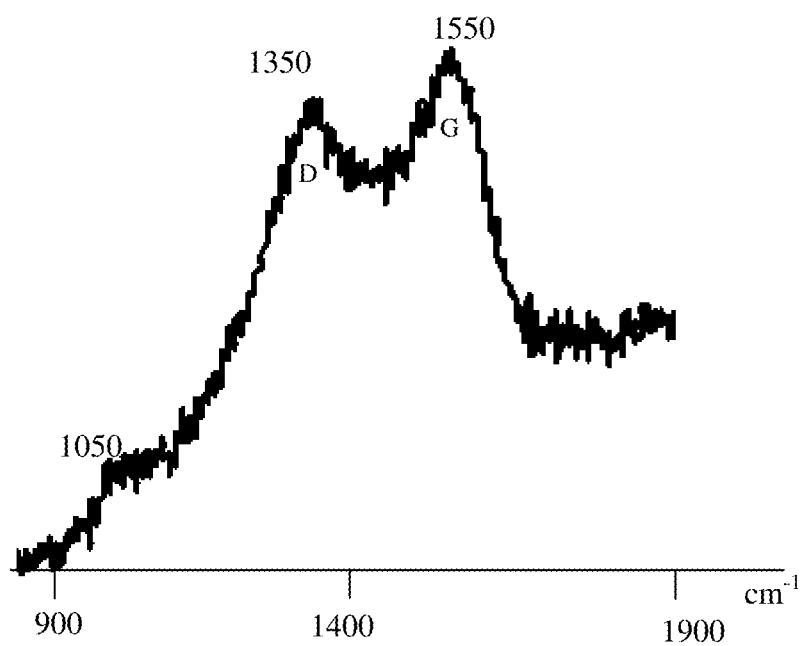

FIGS. 9A-9B exemplarily illustrate graphical representations of spectrums obtained from Raman spectroscopy performed on a boron filled hybrid carbon nanotube, using 632 nm and 532 nm wavelength excitation lasers. On performing Raman spectroscopy on the boron filled hybrid carbon nanotube, the Raman spectrum obtained is exemplarily illustrated in FIG. 9A. Every band in the Raman spectrum corresponds directly to a specific vibrational frequency of a bond within the boron filled hybrid carbon nanotube. The vibrational frequency and hence the position of the band is sensitive to the orientation of the bands and weight of atoms at either end of the bond within the boron filled hybrid carbon nanotube. The 1582 cm$^{-1}$ band is referred to as a graphite band (G-band) and the band around 1350 cm$^{-1}$ is referred to as either a disorder or defect band (D-band). The Raman spectrum shows that the nanostructure, that is, the boron filled hybrid carbon nanotube is similar to that of a multi-walled carbon nanotube (MWCNT) except that the spectra is highly disordered, as the D-band is found to be much higher in intensity in comparison to the G-band when using a 632 nm wavelength laser. There is a slight shift in the D-band and the G-band when using a 532 nm wavelength laser and the intensity of the D-band decreases in intensity as exemplarily illustrated in FIG. 9B. The high level of distortion is also apparent in the interlayer spacing of the boron filled hybrid carbon nanotube, which is, for example, about 0.36 nm to about 0.39 nm, and larger than the normal spacing of 0.34 nm between carbon layers in a comparable standalone carbon nanotube.

Figure 10:
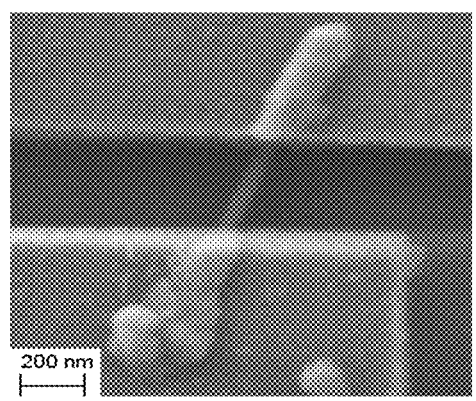
FIG. 10 exemplarily illustrates a scanning electron microscopy image of a boron filled hybrid carbon nanotube undergoing a two point probe measurement to determine electrical properties of the boron filled hybrid carbon nanotube.

Since the carbon in the outer multi-walled carbon based nanotube of the boron filled hybrid carbon nanotube is different from a conventional carbon nanotube, electrical properties of the boron filled hybrid carbon nanotube is compared with electrical properties of conventional carbon nanotubes as disclosed in the detailed description of FIG. 10. Furthermore, to determine whether the boron filled hybrid carbon nanotube is useful as an electronic device because of the heterostructure nature of the boron filled hybrid carbon nanotube, the interior boron based nanowire is analyzed as disclosed in the detailed description of FIG. 10.

FIG. 10 exemplarily illustrates a scanning electron microscopy image of a boron filled hybrid carbon nanotube undergoing a two point probe measurement to determine electrical properties of the boron filled hybrid carbon nanotube. As used herein, "two point probe measurement" refers to a method for determining electrical properties of the boron filled hybrid carbon nanotube by attaching two probes to the boron filled hybrid carbon nanotube at a known distance, and then passing a current between the two probes and measuring a voltage drop. The two point probe measurement provides the resistance via Ohm's law, V=IR, where V is the voltage, I is the current, and R is the resistance. In an embodiment, by varying the constituents and temperature of the boron filled hybrid carbon nanotube, other properties such as whether the boron filled hybrid carbon nanotube is a metal or a semiconductor are studied.

Both the interior boron based nanowire and the outer carbon based nanotube of the boron filled hybrid carbon nanotube produced using the method disclosed in the detailed description of FIGS. 1A-2, are determined to be substantially insulating. That is, internal electric charges of the interior boron based nanowire and the outer carbon based nanotube of the boron filled hybrid carbon nanotube do not flow freely and therefore do not conduct electric current under the influence of an electric field. Conduction at the highest voltages occurred only because the underlying layer of the substrate material, for example, silicon dioxide, broke down and the current travelled through the silicon. For the outer carbon based nanotube, the result of the two point probe measurement indicates the number of defects in structure. The boron filled hybrid carbon nanotube is found to be less conducting than amorphous carbon, suggesting an unusually high density of defects. The insulating nature of the boron filled hybrid carbon nanotube is confirmed with three separate electrical measurements, that is, using the two point probe measurement, a S100 nanomanipulator that is a part of the NanoWorks® Tools product line of Zyvex Instruments, LLC used with a scattering electron microscope (SEM), and a PI-85 SEM PicoIndenter® of Hysitron, Incorporated. The PI-85 PicoIndenter is a depth-sensing indenter that can be interfaced with the SEM. The PI-85 PicoIndenter is also used to determine compressive radial mechanical properties of the boron filled hybrid carbon nanotube.

Figure 11:
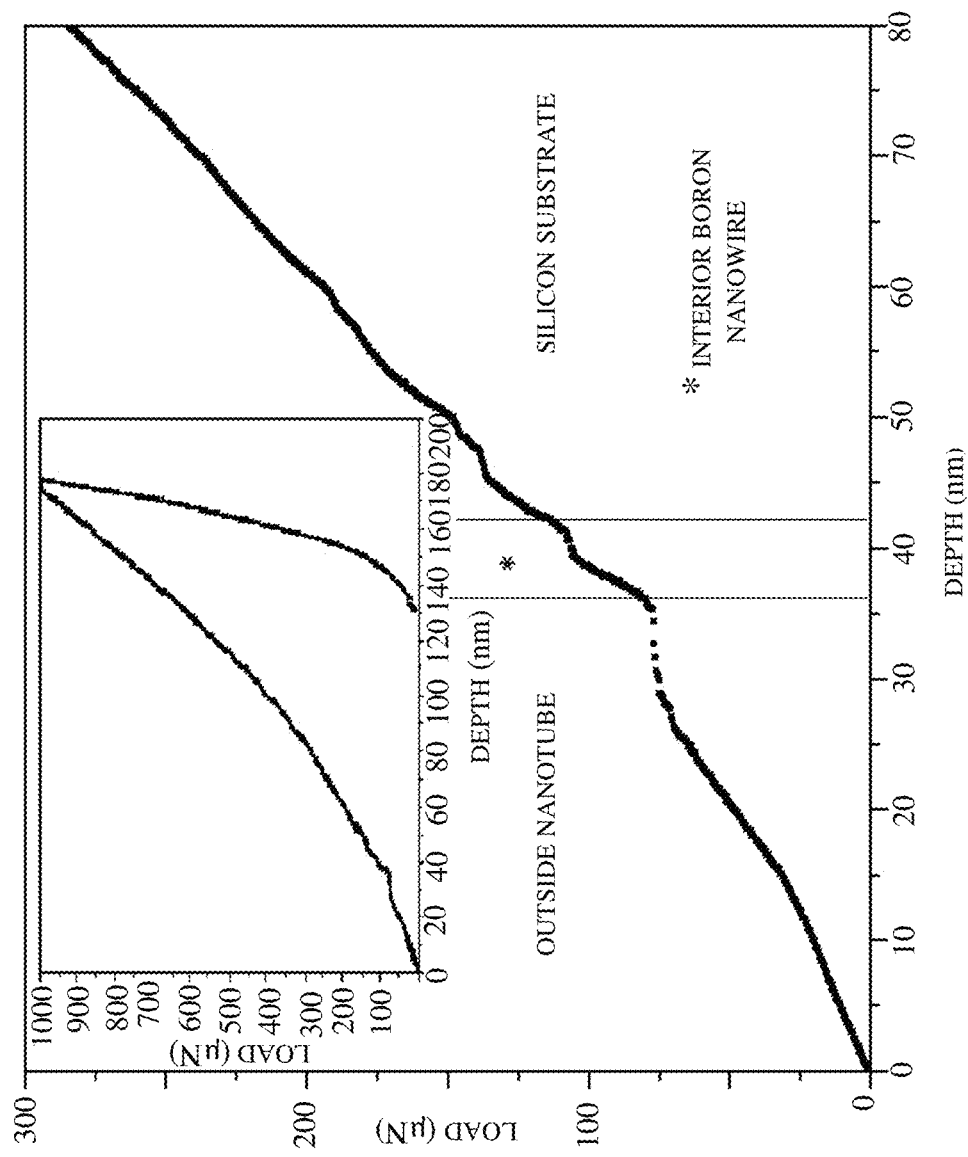
FIG. 11 exemplarily illustrates a graphical representation showing a load displacement curve obtained by performing a radial compression test on a boron filled hybrid carbon nanotube.

FIG. 11 exemplarily illustrates a graphical representation showing a load displacement curve obtained by performing a radial compression test on a boron filled hybrid carbon nanotube. In the radial compression test, a boron filled hybrid carbon nanotube is loaded with increasing force. The strain induced in the nanostructure, that is, the boron filled hybrid carbon nanotube by the force is then recorded. A load-displacement curve is created and is used to compare mechanical properties of the outer carbon based nanotube of the boron filled hybrid carbon nanotube with a conventional carbon nanotube. The first part of the load-displacement curve demonstrates enhanced stiffness and strength of the outer carbon based nanotube of the boron filled hybrid carbon nanotube over a conventional carbon nanotube. Furthermore, after the outer carbon based nanotube of the boron filled hybrid carbon nanotube fails, the interior boron based nanowire supports even greater amounts of loading with enhanced rigidity. The measurements demonstrate that notwithstanding the large number of defects in the structure of the boron filled hybrid carbon nanotube, the boron filled hybrid carbon nanotube possesses enhanced mechanical properties and flexibility for a heterogeneous material.

Load displacement measurement tests are performed on several boron filled hybrid carbon nanotubes, conventional carbon nanotubes, and carboxyl-functionalized carbon nanotubes, and the data is summarized in the following table.

| Material | Fail loading at room temperature (in micronewton ($\mu N$)) | Fail temperature at 30 $\mu N$ (in ° C.) | Stiffness in comparison to a conventional carbon nanotube (in %) |
| --- | --- | --- | --- |
| Boron filled hybrid carbon nanotube-outer carbon based nanotube | 75 | 200 | 130 |
| Boron filled hybrid carbon nanotube-inner boron based nanowire | 100 | >300 | NA |
| Conventional carbon nanotube | 30 | Room temperature | 100 |
| Carboxyl-functionalized carbon nanotube | 50 (30 nm depth pen.) | 200 | 110 |

As exemplarily illustrated in the above table, the testing focused on three parameters, stiffness, failure loading at room temperature, and failure temperature under 30 $\mu N$ of force. Stiffness is determined by an average deflection of the boron filled hybrid carbon nanotubes, the conventional carbon nanotubes, and the carboxyl-functionalized carbon nanotubes, at 30 $\mu N$ of force. Analysis of raw mechanical data is performed by evaluating the displacement allowed by the boron filled hybrid carbon nanotubes, the conventional carbon nanotubes, and carboxyl-functionalized carbon nanotubes under identical loading conditions. In the three parameters, the boron filled hybrid carbon nanotubes have better mechanical properties in comparison to the conventional carbon nanotubes and the carboxyl functionalized carbon nanotubes. Since the structures of the boron filled hybrid carbon nanotubes are corrugated and can be functionalized naturally when exposed to air or organic solvents, comparisons to both unfunctionalized or pristine carbon nanotubes and functionalized carbon nanotubes are made. Furthermore, functionalized carbon nanotubes are often used in mechanical applications. While the carboxyl-functionalized carbon nanotubes are found to possess enhanced strength compared to the unfunctionalized carbon nanotubes, the boron filled hybrid carbon nanotubes outperformed the unfunctionalized carbon nanotubes and the carboxyl-functionalized carbon nanotubes by a significant margin. The boron filled hybrid carbon nanotubes are on average, for example, about 30% stiffer than the unfunctionalized carbon nanotubes, and the outer carbon based nanotubes of the boron filled hybrid carbon nanotubes support about 2.5 times more force before failing. The inner boron based nanowires of the boron filled hybrid carbon nanotube further shows resistance to deformation by about another 25 $\mu N$, making the entire structure of the boron filled hybrid carbon nanotube over 3 times stronger than an unfunctionalized carbon nanotube. The superiority of the boron filled hybrid carbon nanotubes continued into elevated temperatures. Many of the unfunctionalized carbon nanotubes failed at room temperature with 30 $\mu N$ force, and all of the tested ones failed at about 100° C. The functionalized carbon nanotubes and the outer carbon based nanotubes of the boron filled hybrid carbon nanotubes survived 30 $\mu N$ of force until about 200° C. The interior boron based nanowires of the boron filled hybrid carbon nanotubes, however, are resistant to failure, for example, up to about 300° C.

The boron filled hybrid carbon nanotubes possess enhanced mechanical, enhanced thermal and enhanced electrical properties over the constituent boron based nanowires and carbon based nanotubes. The boron filled hybrid carbon nanotubes with the enhanced mechanical properties, the enhanced thermal properties, and the enhanced electrical properties find applications in multiple domains. The boron filled hybrid carbon nanotube finds use as a precursor or a catalyst in a chemical reaction, as a template for stabilizing an unstable material, for purifying liquids or gases, and in microelectromechanical system (MEMS) type devices. In an embodiment, boron filled hybrid carbon nanotubes containing enriched or depleted boron find use in radiation shielding applications.

Boron filled hybrid carbon nanotubes are synthesized by performing a chemical vapor deposition process or a physical vapor deposition process on specialized catalysts and reactants using a carbon containing reactant gas or a solid carbon precursor. Examples for producing boron filled hybrid carbon nanotubes with enhanced mechanical properties are disclosed below.

Example 1

Consider an example where about 50% by weight of magnesium diboride ($MgB_2$) and about 30% by weight of nickel boride (NiB) are mixed and ground for about an hour in an agate mortar and a rotary mixer. Magnesium diboride is the boron containing nanowire producing compound and nickel boride is the catalyst for the chemical vapor deposition process. In this example, about 20% by weight of a substrate material such as porous silicon is added to the ground mixture. A chemical vapor deposition process is then performed on the ground mixture by subjecting the ground mixture to about 90.9% by volume of an inert gas such as argon and about 9.1% by volume of a carbon containing reactant gas such as methane in a quartz reactor at a reaction temperature of 950° C. at a rate of 10° C./min and at a reaction pressure of 1000 torr for about an hour to produce boron filled hybrid carbon nanotubes. In this example, the carbon based nanotubes are produced from the reactant gas, that is, methane, which is fed at 9.1% volume concentration with argon, the inert gas.

The boron filled hybrid carbon nanotubes are subsequently purified using a purifying agent, for example, about 100% by weight of an acid such as nitric acid followed by about 100% by weight of a base such as sodium hydroxide to remove unwanted byproducts. Treatment of the boron filled hybrid carbon nanotubes with a purifying agent, for example, a surfactant such as poly (propionylethylenimine-co-ethylenimine) functionalizes the boron filled hybrid carbon nanotubes. The functionalized boron filled hybrid carbon nanotubes are dispersed in a liquid such as water, forming a suspension. The suspension is decanted to remove insoluble materials, and is then vacuum filtered forming a thin, strong, paper like material attached to a filter. The filter is removed with a mechanical means resulting in a nanopaper. The nanopaper is strong while maintaining flexibility. The nanopaper exhibits enhanced compressive and tensile yield and failure strength. The failure strength of the nanopaper improves, for example, by about 50%. For example, the Young's modulus of the nanopaper improves from about 10 gigapascal (GPa) to about 15 GPa. The nanopaper exhibits these enhanced mechanical properties even at elevated temperatures, for example, up to 800° C. The improvement in the failure strength, for example, is about 10% to about 500%. The nanopaper finds application, for example, as body armor. In an embodiment, solvent methods are married to those using electric fields for added precision. That is, electric fields are used to assist with aligning the boron filled hybrid carbon nanotubes in a particular direction.

Example 2

Consider an example where about 90% by weight of magnesium borohydride $Mg(BH_4)_2$, a boron containing nanowire producing compound, and about 5% by weight of a catalyst such as iron boride are mixed and ground for about an hour in an agate mortar and a rotary mixer. In this example, about 5% by weight of a substrate material such as porous silicon is added to the ground mixture. A chemical vapor deposition process is then performed on the ground mixture by subjecting the ground mixture to about 90% by volume of an inert gas such as xenon and about 10% by volume of a carbon containing reactant gas such as acetylene in a quartz reactor at a reaction temperature of 950° C. at a rate of 10° C./min and at a reaction pressure of 1000 torr for about an hour to produce boron filled hybrid carbon nanotubes. The nanotube producing reactant gas is the carbon containing reactant gas in this example. The boron filled hybrid carbon nanotubes are subsequently purified using, for example, about 50% by weight of an acid such as hydrochloric acid with about 50% by weight of water, and about 50% by weight of a base such as sodium hydroxide with about 50% by weight of water to remove unwanted byproducts. This treatment functionalizes the boron filled hybrid carbon nanotubes. The functionalized boron filled hybrid carbon nanotubes are dispersed in a liquid such as water, forming a suspension. The suspension is electrospun or spun by another method that is known in the art to form a strong bundle. The bundle finds use as a strong wire as required in suspension style applications, or is woven into a mesh. The bundle exhibits enhanced compressive and tensile yield and failure strength. Also, Young's modulus of the bundle improves, for example, by about 30% to about 40%. The bundle exhibits these enhanced properties even at elevated temperatures, for example, up to 800° C. Improvement in tensile strength, for example, is about 10% to about 500%. That is, the yield strength of the bundle improves, for example, from about 2 GPa to about 10 GPa. In an embodiment, solvent methods are married to those using electric fields for added precision and alignment of the boron filled hybrid carbon nanotubes in a particular direction.

Example 3

Consider an example where about 45% by weight of magnesium borohydride $Mg(BH_4)_2$, about 45% by weight of boron carbon nitride, and about 5% by weight of a catalyst such as iron boride are mixed and ground for about an hour in an agate mortar and a rotary mixer. Magnesium borohydride $Mg(BH_4)_2$ is the boron containing nanowire producing compound and boron carbon nitride is the nanotube producing compound. In this example, about 5% by weight of a substrate material such as porous silicon is added to the ground mixture. A physical vapor deposition process is then performed on the ground mixture by subjecting the ground mixture to about 100% by volume of an inert gas such as xenon in a quartz reactor at a reaction temperature of 950° C. at a rate of 10° C./min and at a reaction pressure of 1000 torr for about an hour to produce boron filled hybrid carbon nanotubes. The boron filled hybrid carbon nanotubes are subsequently purified using, for example, about 50% by weight of an acid such as hydrochloric acid with about 50% by weight of water, and about 50% by weight of a base such as sodium hydroxide with about 50% by weight of water to remove unwanted byproducts. This treatment functionalizes the boron filled hybrid carbon nanotubes. The functionalized boron filled hybrid carbon nanotubes are dispersed in a liquid such as water, forming a suspension. The suspension is electrospun or spun by another method that is known in the art to form a strong bundle. The bundle finds use as a strong wire as required in suspension style applications, or is woven into a mesh. The bundle exhibits enhanced compressive and tensile yield and failure strength. Also, Young's modulus of the bundle improves, for example, by about 30% to about 40%. The bundle exhibits these enhanced properties even at elevated temperatures, for example, up to 800° C. Improvement in tensile strength, for example, is about 10% to about 500%. That is, the yield strength of the bundle improves, for example, from about 2 GPa to about 10 GPa. In an embodiment, solvent methods are married to those using electric fields for added precision and alignment of the boron filled hybrid carbon nanotubes in a particular direction.

Example 4

Consider an example where about 90% by weight of boron oxide, a boron containing nanowire producing compound, and about 5% by weight of a catalyst such as iron boride are mixed and ground for about an hour in an agate mortar and a rotary mixer. In this example, about 5% by weight of a substrate material such as porous silicon is added to the ground mixture. A chemical vapor deposition process is then performed on the ground mixture by subjecting the ground mixture to about 95% by volume of an inert gas such as nitrogen and about 5% by volume of a carbon containing reactant gas such as carbon monoxide in a quartz reactor at a reaction temperature of 950° C. at a rate of 10° C./min and at a reaction pressure of 1000 torr for about an hour to produce boron filled hybrid carbon nanotubes. The nanotube producing reactant gas is the carbon containing reactant gas in this example. The boron filled hybrid carbon nanotubes are subsequently purified using, for example, about 5% by weight of a surfactant such as Triton™ X-100 to remove unwanted byproducts in an aqueous suspension. This treatment functionalizes the boron filled hybrid carbon nanotubes. The functionalized boron filled hybrid carbon nanotubes are dispersed in a solvent, for example, acetone with a dissolved polymer, for example, polyvinyl acetate, to form a suspension. Using ultrasonic dispersion and heating, the solvent is driven off while keeping the boron filled hybrid carbon nanotubes in suspension. This process results in a polymer composite with enhanced mechanical properties in comparison to a neat polymer. The polymer composite exhibits enhanced compressive and tensile yield and failure strength. Also, Young's modulus of the polymer composite improves, for example, from about 50 megapascal (MPa) to about 100 MPa. The polymer composite exhibits these enhanced properties even at elevated temperatures, for example, up to 400° C. Improvements in yield strength of the polymer composite is, for example, about 10% to about 500%. In an embodiment, solvent methods are married to those using electric fields for added precision and alignment of the boron filled hybrid carbon nanotubes in a particular direction.

Example 5

Consider an example where about 45% by weight of boron oxide, about 45% by weight of boron nitride, and about 5% by weight of a catalyst such as iron boride are mixed and ground for about an hour in an agate mortar and a rotary mixer. Boron oxide is the boron containing nanowire producing compound and boron nitride is the nanotube producing compound. In this example, about 5% by weight of a substrate material such as porous silicon is added to the ground mixture. A physical vapor deposition process is then performed on the ground mixture by subjecting the ground mixture to about 100% by volume of an inert gas such as nitrogen in a quartz reactor at a reaction temperature of 950° C. at a rate of 10° C./min and at a reaction pressure of 760 torr for about an hour to produce boron filled hybrid carbon nanotubes. The boron filled hybrid carbon nanotubes are subsequently purified using, for example, about 5% by weight of a surfactant such as Triton™ X-100 to remove unwanted byproducts in an aqueous suspension. This treatment functionalizes the boron filled hybrid carbon nanotubes. The functionalized boron filled hybrid carbon nanotubes are dispersed in a solvent, for example, acetone with a dissolved polymer, for example, polyvinyl acetate, to form a suspension. Using ultrasonic dispersion and heating, the solvent is driven off while keeping the boron filled hybrid carbon nanotubes in suspension. This process results in a polymer composite with enhanced mechanical properties in comparison to a neat polymer. The polymer composite exhibits enhanced compressive and tensile yield and failure strength. Also, Young's modulus of the polymer composite improves, for example, from about 50 MPa to about 100 MPa. The polymer composite exhibits these enhanced properties even at elevated temperatures, for example, up to 400° C. Improvements in yield strength of the polymer composite is, for example, about 10% to about 500%. In an embodiment, solvent methods are married to those using electric fields for added precision and alignment of the boron filled hybrid carbon nanotubes in a particular direction.

Example 6

Consider an example where about 40% by weight of calcium hexaboride, a boron containing nanowire producing compound, about 40% by weight of carbon, a nanotube producing material, and about 5% by weight of a catalyst such as boron carbide are mixed and ground for about an hour in an agate mortar and a rotary mixer. In this example, about 5% by weight of a substrate material such as porous silicon is added to the ground mixture. The ground mixture also contains 10% by weight of a solid carbon precursor such as iron phthalocyanine. A physical vapor deposition process is then performed on the ground mixture in a quartz reactor by subjecting the ground mixture to about 100% by volume of an inert gas such as krypton at a reaction temperature of 950° C. at a rate of 10° C./min and at a reaction pressure of 760 torr for about an hour to produce boron filled hybrid carbon nanotubes. The boron filled hybrid carbon nanotubes are subsequently purified using, for example, about 75% by weight of an acid such as nitric acid with about 25% by weight of water, and about 75% by weight of a base such as sodium hydroxide with about 25% by weight of water to remove unwanted byproducts. This treatment functionalizes the boron filled hybrid carbon nanotubes. The functionalized boron filled hybrid carbon nanotubes are added to a heated thermoplastic polymer, for example, nylon or Teflon® of the Chemours Company FC, LLC. The softened polymer with the boron filled hybrid carbon nanotubes is added to a high shear mixing device, for example, a twin screw extruder, and forced through a die set. This process results in a polymer composite with enhanced mechanical properties in comparison to a neat polymer, while providing control over the final shape of the polymer. The polymer composite exhibits enhanced compressive and tensile yield and failure strength. Also, Young's modulus of the polymer composite improves, for example, from about 100 MPa to about 200 MPa. The polymer composite exhibits these enhanced properties even at elevated temperatures, for example, up to 400° C. Improvement in yield strength of the polymer composite is, for example, from about 10 MPa to about 30 MPa, that is, about 200% improvement. In an embodiment, solvent methods are married to those using electric fields for added precision and alignment of the boron filled hybrid carbon nanotubes in a particular direction.

Example 7

Consider an example where about 40% by weight of calcium hexaboride, a boron containing nanowire producing compound, about 40% by weight of titania, a nanotube producing compound, and about 5% by weight of a catalyst such as boron carbide are mixed and ground for about an hour in an agate mortar and a rotary mixer. In this example, about 5% by weight of a substrate material such as porous silicon is added to the ground mixture. The ground mixture also contains 10% by weight of a solid carbon precursor such as iron phthalocyanine. A physical vapor deposition process is then performed on the ground mixture in a quartz reactor by subjecting the ground mixture to about 100% by volume of an inert gas such as krypton at a reaction temperature of 950° C. at a rate of 10° C./min and at a reaction pressure of 760 torr for about an hour to produce boron filled hybrid carbon nanotubes. The boron filled hybrid carbon nanotubes are subsequently purified using, for example, about 75% by weight of an acid such as nitric acid with about 25% by weight of water, and about 75% by weight of a base such as sodium hydroxide with about 25% by weight of water to remove unwanted byproducts. This treatment functionalizes the boron filled hybrid carbon nanotubes. The functionalized boron filled hybrid carbon nanotubes are added to a heated thermoplastic polymer, for example, nylon or Teflon® of the Chemours Company FC, LLC. The softened polymer with the boron filled hybrid carbon nanotubes is added to a high shear mixing device, for example, a twin screw extruder, and forced through a die set. This process results in a polymer composite with enhanced mechanical properties in comparison to a neat polymer, while providing control over the final shape of the polymer. The polymer composite exhibits enhanced compressive and tensile yield and failure strength. Also, Young's modulus of the polymer composite improves, for example, from about 100 MPa to about 200 MPa. The polymer composite exhibits these enhanced properties even at elevated temperatures, for example, up to 400° C. Improvement in yield strength of the polymer composite is, for example, from about 10 MPa to about 30 MPa, that is, about 200% improvement. In an embodiment, solvent methods are married to those using electric fields for added precision and alignment of the boron filled hybrid carbon nanotubes in a particular direction.

Example 8

Consider an example where about 45% by weight of magnesium diboride ($MgB_2$), a boron containing nanowire producing compound, about 45% by weight of tungsten sulfide, a nanotube producing compound, and about 5% by weight of a catalyst such as boron carbide are mixed and ground for about an hour in an agate mortar and a rotary mixer. In this example, about 5% by weight of a substrate material such as porous silicon is added to the ground mixture. A physical vapor deposition process is then performed on the ground mixture by subjecting the ground mixture to about 100% by volume of an inert gas such as radon in a quartz reactor at a reaction temperature of 950° C. at a rate of 10° C./min and at a reaction pressure of 760 torr for about an hour to produce boron filled hybrid carbon nanotubes. The boron filled hybrid carbon nanotubes are subsequently purified using, for example, about 100% by weight of an acid, for example, hydrochloric acid and about 100% by weight of a base such as sodium hydroxide to remove unwanted byproducts. This treatment functionalizes the boron filled hybrid carbon nanotubes. The functionalized boron filled hybrid carbon nanotubes are added to liquid oligomers. The liquid oligomers are cured while keeping the boron filled hybrid carbon nanotubes in suspension using, for example, high shear mixing or an ultrasound resulting in a high strength polymer composite. The high strength polymer composite exhibits enhanced compressive and tensile yield and failure strength. Also, Young's modulus of the high strength polymer composite improves, for example, from about 75 MPa to about 125 MPa. The high strength polymer composite exhibits these enhanced properties even at elevated temperatures, for example, up to 400° C. Improvement in yield strength of the high strength polymer composite is, for example, about 50%, that is, from about 150 MPa to about 225 MPa. In an embodiment, solvent methods are married to those using electric fields for added precision and alignment of the boron filled hybrid carbon nanotubes in a particular direction.

Example 9

Consider an example where about 45% by weight of titanium diboride, a boron containing nanowire producing compound, about 45% by weight of boron carbon nitride, a nanotube producing compound, and about 5% by weight of a catalyst such as rhenium diboride are mixed and ground for about an hour in an agate mortar and a rotary mixer. In this example, about 5% by weight of a substrate material such as porous silicon is added to the ground mixture. A physical vapor deposition process is then performed on the ground mixture by subjecting the ground mixture to about 100% by volume of an inert gas such as neon in a quartz reactor at a reaction temperature of 950° C. at a rate of 10° C./min and at a reaction pressure of 760 torr for about an hour to produce boron filled hybrid carbon nanotubes. The boron filled hybrid carbon nanotubes are subsequently purified using, for example, about 10% by weight of an acid such as nitric acid in water and about 10% by weight of a base such as sodium hydroxide in water to remove unwanted byproducts. This treatment functionalizes the boron filled hybrid carbon nanotubes. The functionalized boron filled hybrid carbon nanotubes are added to a metal, for example, iron or stainless steel, and/or ceramic powders, for example, boron carbide or boron nitride, and mixed intimately. The mixing is performed using high shear techniques, for example, high speed mixing, vertical mixing, and milling. The mixed powder is consolidated using high pressure pressing and heating. This process results in a material that is strong and tough. This resultant material finds use as a structural component, for example, in an aircraft, in tooling to form strong blades and drills, and in armor for military and civilian applications. The resultant material exhibits enhanced compressive and tensile yield and failure strength. Also, Young's modulus of the resultant material improves, for example, from 300 MPa to about 400 MPa. The resultant material exhibits enhanced properties even at elevated temperatures, for example, up to about 400° C. Improvement in failure strength is about 100%, for example, improving from about 500 MPa to about 1 GPa. In an embodiment, solvent methods are married to those using electric fields for added precision and alignment of the boron filled hybrid carbon nanotubes in a particular direction.

Example 10

Consider an example where about 45% by weight of titanium diboride, about 45% by weight of magnesium borohydride $Mg(BH_4)_2$, and about 5% by weight of a catalyst such as rhenium diboride are mixed and ground for about an hour in an agate mortar and a rotary mixer. Titanium diboride and magnesium borohydride $Mg(BH_4)_2$ are the boron containing nanowire producing compounds. In this example, about 5% by weight of a substrate material such as porous silicon is added to the ground mixture. A chemical vapor deposition process is then performed on the ground mixture by subjecting the ground mixture to about 80% by volume of an inert gas such as radon and about 20% by volume of a carbon containing reactant gas such as methane in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. The boron filled hybrid carbon nanotubes are subsequently purified using, for example, about 10% by weight of an acid such as nitric acid in water and about 10% by weight of a base such as sodium hydroxide in water to remove unwanted byproducts. This treatment functionalizes the boron filled hybrid carbon nanotubes. The functionalized boron filled hybrid carbon nanotubes are added to a metal, for example, iron or stainless steel, and/or ceramic powders, for example, boron carbide or boron nitride, and mixed intimately. The mixing is performed using high shear techniques, for example, high speed mixing, vertical mixing, and milling. The mixed powder is consolidated using high pressure pressing and heating. This process results in a material that is strong and tough. This resultant material finds use as a structural component, for example, in aircraft, in tooling to form strong blades and drills, and in armor for military and civilian applications. The resultant material exhibits enhanced compressive and tensile yield and failure strength. Also, Young's modulus of the resultant material improves, for example, from 300 MPa to about 400 MPa. The resultant material exhibits enhanced properties even at elevated temperatures, for example, up to about 400° C. Improvement in failure strength is about 100%, for example, improving from about 500 MPa to about 1 GPa. In an embodiment, solvent methods are married to those using electric fields for added precision and alignment of the boron filled hybrid carbon nanotubes in a particular direction.

Examples for producing boron filled hybrid carbon nanotubes with enhanced electrical properties are disclosed below.

Example 11

Consider an example where about 90% by weight of rhenium diboride, a boron containing nanowire producing compound, and about 5% by weight of a catalyst such as zirconium diboride are mixed and ground for about an hour in an agate mortar and a rotary mixer. In this example, about 5% by weight of a substrate material such as porous silicon is added to the ground mixture. A chemical vapor deposition process is then performed on the ground mixture by subjecting the ground mixture to about 88% by volume of an inert gas such as carbon dioxide and about 12% by volume of a carbon containing reactant gas such as methane in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. The boron filled hybrid carbon nanotubes are subsequently purified using, for example, about 70% by weight of an acid such as nitric acid in water and about 60% by weight of a base such as sodium hydroxide in water to remove unwanted byproducts. This treatment functionalizes the boron filled hybrid carbon nanotubes. The functionalized boron filled hybrid carbon nanotubes are dispersed in a liquid such as water, forming a suspension. The suspension is vacuum filtered forming a thin, strong, paper like material attached to a filter. The filter is removed with a mechanical means resulting in a nanopaper. The nanopaper is electrically insulating, thereby making the nanopaper useful as a component in electrical systems where electrical insulation is required. The nanopaper finds applications in high performance small electrical components such as in integrated circuits or in high voltage power transmission. The nanopaper exhibits enhanced electrical properties, for example, insulation or conductive properties. Depending on constituents, semiconducting properties such as band gap are also improved. Band gap is improved, for example, by about 1 electron volt (eV) to about 10 eV, and conductivity or insulation properties are improved by several orders of magnitude. In an embodiment, solvent methods are married to those using electric fields for added precision and alignment of the boron filled hybrid carbon nanotubes in a particular direction.

Example 12

Consider an example where about 45% by weight of rhenium diboride, a boron containing nanowire producing compound, about 45% by weight of boron carbon nitride, a nanotube producing compound, and about 5% by weight of a catalyst such as zirconium diboride are mixed and ground for about an hour in an agate mortar and a rotary mixer. In this example, about 5% by weight of a substrate material such as porous silicon is added to the ground mixture. A physical vapor deposition process is then performed on the ground mixture by subjecting the ground mixture to about 100% by volume of an inert gas such as carbon dioxide in a quartz reactor at a reaction temperature of 950° C. at a rate of 10° C./min and at a reaction pressure of 760 torr for about an hour to produce boron filled hybrid carbon nanotubes. The boron filled hybrid carbon nanotubes are subsequently purified using, for example, about 70% by weight of an acid such as nitric acid in water and about 60% by weight of a base such as sodium hydroxide in water to remove unwanted byproducts. This treatment functionalizes the boron filled hybrid carbon nanotubes. The functionalized boron filled hybrid carbon nanotubes are dispersed in a liquid forming a suspension. The suspension is vacuum filtered forming a thin, strong paper like material attached to a filter. The filter is removed with a mechanical means resulting in a nanopaper. The nanopaper is electrically insulating, thereby making the nanopaper useful as a component in electrical systems where electrical insulation is required. The nanopaper finds applications in high performance small electrical components such as in integrated circuits or in high voltage power transmission. The nanopaper exhibits enhanced electrical properties, for example, insulation or conductive properties. Depending on constituents, semiconducting properties such as band gap are also improved. Band gap is improved, for example, by about 1 eV to about 10 eV, and conductivity or insulation properties are improved by several orders of magnitude. In an embodiment, solvent methods are married to those using electric fields for added precision and alignment of the boron filled hybrid carbon nanotubes in a particular direction.

Example 13

Consider an example where about 45% by weight of zirconium diboride, a boron containing nanowire producing compound, about 45% by weight of boron carbon nitride, a nanotube producing compound, and about 5% by weight of a catalyst such as nickel boride are mixed and ground for about an hour in an agate mortar and a rotary mixer. In this example, about 5% by weight of a substrate material such as porous ceramic is added to the ground mixture. A physical vapor deposition process is then performed on the ground mixture by subjecting the ground mixture to about 100% by volume of an inert gas such as helium in a quartz reactor at a reaction temperature of 950° C. at a rate of 10° C./min and at a reaction pressure of 760 torr for about an hour to produce boron filled hybrid carbon nanotubes. The boron filled hybrid carbon nanotubes are subsequently purified using, for example, about 50% by weight of an acid such as hydrochloric acid in water and about 50% by weight of a base such as sodium hydroxide in water to remove unwanted byproducts. This treatment functionalizes the boron filled hybrid carbon nanotubes. The functionalized boron filled hybrid carbon nanotubes are dispersed in a liquid such as water, forming a suspension. The suspension is electrospun or spun by another method that is known in the art to form a highly electrically insulating bundle. The bundle is useful for shielding for wires or in high voltage power transmission. The bundle exhibits enhanced electrical properties, for example, insulation or conductive properties. Depending on the constituents, semiconducting properties such as band gap are also improved. Band gap is improved, for example, by about 1 eV to about 10 eV, and conductivity or insulation properties are improved by several orders of magnitude. In an embodiment, solvent methods are married to those using electric fields for added precision and alignment of the boron filled hybrid carbon nanotubes in a particular direction.

Example 14

Consider an example where about 45% by weight of magnesium diboride, about 45% by weight of nickel boride, and about 5% by weight of a catalyst such as iron boride are mixed and ground for about an hour in an agate mortar and a rotary mixer. Magnesium diboride and nickel boride are the boron containing nanowire producing compounds. In this example, about 5% by weight of a substrate material such as porous silicon is added to the ground mixture. A chemical vapor deposition process is then performed on the ground mixture by subjecting the ground mixture to about 83% by volume of an inert gas such as argon and about 17% by volume of a carbon containing reactant gas such as carbon monoxide in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. The boron filled hybrid carbon nanotubes are subsequently purified using, for example, about 100% by weight of an acid such as nitric acid and about 100% by weight of a base such as sodium hydroxide to remove unwanted byproducts. The boron filled hybrid carbon nanotubes are used as dielectric gates, or otherwise as an insulating material in an integrated circuit. Placement of the boron filled hybrid carbon nanotubes in an integrated circuit is achieved in principle using solvent methods. The boron filled hybrid carbon nanotubes exhibits enhanced electrical properties, for example, insulation or conductive properties. Depending on constituents, semiconducting properties such as band gap are also improved. Band gap is improved, for example, by about 1 eV to about 10 eV, and conductivity or insulation properties are improved by several orders of magnitude. In an embodiment, solvent methods are married to those using electric fields for added precision and alignment of the boron filled hybrid carbon nanotubes in a particular direction.

Examples for producing boron filled hybrid carbon nanotubes with enhanced thermal properties are disclosed below.

Example 15

Consider an example where about 45% by weight of magnesium diboride, about 45% by weight of nickel boride, and about 5% by weight of a catalyst such as iron boride are mixed and ground for about an hour in an agate mortar and a rotary mixer. Magnesium diboride and nickel boride are the boron containing nanowire producing compounds. In this example, about 5% by weight of a substrate material such as porous silicon is added to the ground mixture. A chemical vapor deposition process is then performed on the ground mixture by subjecting the ground mixture to about 86% by weight of an inert gas such as argon and about 14% by weight of a carbon containing reactant gas such as methane in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. The boron filled hybrid carbon nanotubes are subsequently purified using, for example, about 18% by weight of an acid such as hydrochloric acid in water and about 25% by weight of a base such as sodium hydroxide in water to remove unwanted byproducts. This treatment functionalizes the boron filled hybrid carbon nanotubes. The functionalized boron filled hybrid carbon nanotubes are dispersed in a liquid such as water, forming a suspension. The suspension is vacuum filtered forming a thin, strong, paper like material attached to a filter. The filter is removed with a mechanical means resulting in a nanopaper. The nanopaper is thermally conducting, thereby making the nanopaper useful for applications requiring aggressive cooling or thermoelectrics. The nanopaper exhibits enhanced thermal properties relating to improved stability at a high temperature, high thermal conductivity, and high heat capacity. The thermal properties are improved, for example, by about 5% to several orders of magnitude. In an embodiment, solvent methods are married to those using electric fields for added precision and alignment of the boron filled hybrid carbon nanotubes in a particular direction.

Example 16

Consider an example where about 45% by weight of magnesium diboride, about 45% by weight of nickel boride, and about 5% by weight of a catalyst such as iron boride are mixed and ground for about an hour in an agate mortar and a rotary mixer. Magnesium diboride and nickel boride are the boron containing nanowire producing compounds. In this example, about 5% by weight of a substrate material such as porous silicon is added to the ground mixture. A chemical vapor deposition process is then performed on the ground mixture by subjecting the ground mixture to about 85% by volume of an inert gas such as argon and about 15% by volume of a carbon containing reactant gas such as acetylene in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. The boron filled hybrid carbon nanotubes are subsequently purified using, for example, about 100% by weight of an acid such as nitric acid and about 100% by weight of a base such as sodium hydroxide to remove unwanted byproducts. This treatment functionalizes the boron filled hybrid carbon nanotubes. The functionalized boron filled hybrid carbon nanotubes are dispersed in a liquid such as water, forming a suspension. The suspension is vacuum filtered forming a thin, strong, paper like material attached to a filter. The filter is removed with a mechanical means resulting in a nanopaper. The nanopaper is thermally insulating making the nanopaper useful for applications requiring thermal insulation. The nanopaper exhibits enhanced thermal properties relating to improved stability at a high temperature, high thermal conductivity, and high heat capacity. The thermal properties are improved, for example, by about 5% to several orders of magnitude. In an embodiment, solvent methods are married to those using electric fields for added precision and alignment of the boron filled hybrid carbon nanotubes in a particular direction.

Example 17

Consider an example where about 45% by weight of magnesium diboride, about 45% by weight of nickel boride, and about 5% by weight of a catalyst such as iron boride are mixed and ground for about an hour in an agate mortar and a rotary mixer. Magnesium diboride and nickel boride are the boron containing nanowire producing compounds. In this example, about 5% by weight of a substrate material such as porous silicon is added to the ground mixture. A chemical vapor deposition process is then performed on the ground mixture by subjecting the ground mixture to about 20% by volume of an inert gas such as argon and about 80% by volume of a carbon containing reactant gas such as carbon monoxide in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. The boron filled hybrid carbon nanotubes are subsequently purified using, for example, about 63% by weight of an acid such as hydrochloric acid in water and about 37% by weight of a base such as sodium hydroxide in water to remove unwanted byproducts. This treatment functionalizes the boron filled hybrid carbon nanotubes. The functionalized boron filled hybrid carbon nanotubes are dispersed in a liquid such as water, forming a suspension. The suspension is electrospun, or spun by another method that is known in the art, forming a strong bundle. The functionalized boron filled hybrid carbon nanotubes bundles are thermally conducting, thereby making the functionalized boron filled hybrid carbon nanotubes bundles useful for applications requiring aggressive cooling or thermoelectrics. The bundle exhibits enhanced thermal properties relating to improved stability at a high temperature, high thermal conductivity, and high heat capacity. The thermal properties are improved, for example, by about 5% to several orders of magnitude. In an embodiment, solvent methods are married to those using electric fields for added precision and alignment of the boron filled hybrid carbon nanotubes in a particular direction.

Example 18

Consider an example where about 45% by weight of magnesium diboride, about 45% by weight of nickel boride, and about 5% by weight of a catalyst such as iron boride are mixed and ground for about an hour in an agate mortar and a rotary mixer. Magnesium diboride and nickel boride are the boron containing nanowire producing compounds. In this example, about 5% by weight of a substrate material such as porous silicon is added to the ground mixture. A chemical vapor deposition process is then performed on the ground mixture by subjecting the ground mixture to about 50% by volume of an inert gas such as argon and about 50% by volume of a carbon containing reactant gas such as methane in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. The boron filled hybrid carbon nanotubes are subsequently purified using, for example, about 100% by weight of an acid such as nitric acid and about 100% by weight of a base such as sodium hydroxide to remove unwanted byproducts. This treatment functionalizes the boron filled hybrid carbon nanotubes. The functionalized boron filled hybrid carbon nanotubes are dispersed in a liquid such as water, forming a suspension. The suspension is electrospun, or spun by another method that is known in the art, forming a strong bundle. The functionalized boron filled hybrid carbon nanotubes bundles are thermally insulating, thereby making the functionalized boron filled hybrid carbon nanotube bundles useful for applications requiring thermal insulation. The bundles exhibit enhanced thermal properties relating to improved stability at a high temperature, high thermal conductivity, and high heat capacity. The thermal properties are improved, for example, by about 5% to several orders of magnitude. In an embodiment, solvent methods are married to those using electric fields for added precision and alignment of the boron filled hybrid carbon nanotubes in a particular direction.

Examples for producing boron filled hybrid carbon nanotubes with radiation shielding properties in radiation shielding applications are disclosed below.

Example 19

Consider an example where about 47.5% by weight of magnesium diboride, about 47.5% by weight of nickel boride, and about 5% by weight of a catalyst such as iron boride are mixed and ground for about an hour in an agate mortar and a rotary mixer. Magnesium diboride and nickel boride are the boron containing nanowire producing compounds. A chemical vapor deposition process is then performed on the ground mixture by subjecting the ground mixture to about 99% by volume of an inert gas such as argon and about 1% by volume of a carbon containing reactant gas such as methane in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. By using enriched or depleted boron in the catalyst and reactants, the boron filled hybrid carbon nanotubes are enriched and find applications in neutron capture. The enriched or depleted boron filled hybrid carbon nanotubes are subsequently purified using, for example, about 99% by weight of an acid such as hydrochloric acid in water and about 99% by weight of a base such as sodium hydroxide in water to remove unwanted byproducts. This treatment functionalizes the enriched or depleted boron filled hybrid carbon nanotubes. The functionalized enriched or depleted boron filled hybrid carbon nanotubes are dispersed in liquid such as water, forming a suspension. The suspension is vacuum filtered forming a thin, strong, paper like material attached to a filter. The filter is removed with a mechanical means resulting in a nanopaper. The nanopaper is strong while maintaining flexibility. The use of enriched or depleted boron enables the boron enriched or depleted nanopaper to be used for aerospace applications, for example, structures in deep space where cosmic rays are problematic, nuclear reactions for neutron capture, and for medical imaging applications. On using enriched boron, neutron absorption of the nanopaper is increased, and on using depleted boron, the nanopaper is radiation hardened. The radiation shielding properties of the nanopaper are improved, for example, by about 5% to several orders of magnitude. In the case of radiation hardening of the nanopaper, the production of byproducts from the nanopaper by incident radiation is slowed substantially. In an embodiment, solvent methods are married to those using electric fields for added precision and alignment of the boron filled hybrid carbon nanotubes in a particular direction.

Example 20

Consider an example where about 47.5% by weight of magnesium diboride, about 47.5% by weight of nickel boride, and about 5% by weight of a catalyst such as iron boride are mixed and ground for about an hour in an agate mortar and a rotary mixer. Magnesium diboride and nickel boride are the boron containing nanowire producing compounds. A chemical vapor deposition process is then performed on the ground mixture by subjecting the ground mixture to about 1% by volume of an inert gas such as argon and about 99% by volume of a carbon containing reactant gas such as methane in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. By using enriched or depleted boron in the catalyst and reactants, the boron filled hybrid carbon nanotubes are enriched and find application in neutron capture. The enriched or depleted boron filled hybrid carbon nanotubes are subsequently purified using, for example, about 76% by weight of an acid such as nitric acid in water and about 34% by weight of a base such as sodium hydroxide in water to remove unwanted byproducts. This treatment functionalizes the enriched or depleted boron filled hybrid carbon nanotubes. The functionalized enriched or depleted boron filled hybrid carbon nanotubes are dispersed in a liquid such as water, forming a suspension. The suspension is electrospun, or spun by another method that is known in the art, forming a strong bundle. The bundle is used as a strong wire, as required in suspension style applications, or is woven into a mesh. The use of enriched or depleted boron enables the enriched or depleted boron filled hybrid carbon nanotube bundle to be useful for aerospace applications, for example, structures in deep space where cosmic rays are problematic, nuclear reactions for neutron capture, and for medical imaging applications. On using enriched boron, neutron absorption of the bundle is increased, and on using depleted boron, the bundle is radiation hardened. The radiation shielding properties of the bundle are improved, for example, by about 5% to several orders of magnitude. In the case of radiation hardening of the bundle, the production of byproducts from the bundle by incident radiation is slowed substantially. In an embodiment, solvent methods are married to those using electric fields for added precision and alignment of the boron filled hybrid carbon nanotubes in a particular direction.

Example 21

Consider an example where about 40% by weight of magnesium diboride, about 40% by weight of nickel boride, and about 10% by weight of a catalyst such as iron boride are mixed and ground for about an hour in an agate mortar and a rotary mixer. Magnesium diboride and nickel boride are the boron containing nanowire producing compounds. In this example, about 10% by weight of a substrate material such as porous silicon is added to the ground mixture. A chemical vapor deposition process is then performed on the ground mixture by subjecting the ground mixture to 100% by volume of a carbon containing reactant gas such as acetylene in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. By using enriched or depleted boron in the catalyst and reactants, the boron filled hybrid carbon nanotubes are enriched and find application in neutron capture. The enriched or depleted boron filled hybrid carbon nanotubes are subsequently purified using, for example, about 100% by weight of an acid such as hydrochloric acid and about 100% by weight of a base such as sodium hydroxide to remove unwanted byproducts. This treatment functionalizes the enriched or depleted boron filled hybrid carbon nanotubes. The functionalized enriched or depleted boron filled hybrid carbon nanotubes are dispersed in a solvent, for example, acetone with a dissolved polymer, for example, polyvinyl acetate, forming a suspension. Using ultrasonic dispersion and heating, the solvent is driven off while keeping the enriched or depleted boron filled hybrid carbon nanotubes in suspension. This process results in a polymer composite with enhanced mechanical properties in comparison to a neat polymer. The use of enriched or depleted boron enables the polymer composite to be useful for aerospace applications, for example, structures in deep space where cosmic rays are problematic, nuclear reactions for neutron capture, and for medical imaging applications. On using enriched boron, neutron absorption of the polymer composite is increased, and on using depleted boron, the polymer composite is radiation hardened. The radiation shielding properties of the polymer composite are improved by about 5% to several orders of magnitude. In the case of radiation hardening of the polymer composite, the production of byproducts from the polymer composite by incident radiation is slowed substantially. In an embodiment, solvent methods are married to those using electric fields for added precision and alignment of the boron filled hybrid carbon nanotubes in a particular direction.

Example 22

Consider an example where about 42% by weight of magnesium diboride, about 42% by weight of nickel boride, and about 8% by weight of a catalyst such as iron boride are mixed and ground for about an hour in an agate mortar and a rotary mixer. Magnesium diboride and nickel boride are the boron containing nanowire producing compounds. In this example, about 8% by weight of a substrate material such as porous silicon is added to the ground mixture. A chemical vapor deposition process is then performed on the ground mixture by subjecting the ground mixture to about 77% by volume of an inert gas such as argon and about 23% by volume of a carbon containing reactant gas such as carbon monoxide in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. By using enriched or depleted boron in the catalyst and reactants, the boron filled hybrid carbon nanotubes are enriched and find applications in neutron capture. The enriched or depleted boron filled hybrid carbon nanotubes are subsequently purified using, for example, about 100% by weight of an acid such as nitric acid and about 100% by weight of a base such as sodium hydroxide to remove unwanted byproducts. This treatment functionalizes the enriched or depleted boron filled hybrid carbon nanotubes. The functionalized enriched or depleted boron filled hybrid carbon nanotubes are added to a heated thermoplastic polymer, for example, nylon or Teflon®. The softened polymer with enriched or depleted boron filled hybrid carbon nanotubes is added to a high shear mixing device, for example, a twin screw extruder, and forced through a die set. This process results in a polymer composite with enhanced mechanical properties in comparison to a neat polymer, while providing control over the final shape of the polymer. The use of enriched or depleted boron enables the polymer composite to be useful for aerospace applications, for example, structures in deep space where cosmic rays are problematic, nuclear reactions for neutron capture, and for medical imaging applications. On using enriched boron, neutron absorption of the polymer is increased, and on using depleted boron, the polymer is radiation hardened. The radiation shielding properties of the polymer are improved, for example, by about 5% to several orders of magnitude. In the case of radiation hardening of the polymer, the production of byproducts from the polymer by incident radiation is slowed substantially. In an embodiment, solvent methods are married to those using electric fields for added precision and alignment of the boron filled hybrid carbon nanotubes in a particular direction.

Example 23

Consider an example where about 43% by weight of magnesium diboride, about 3% by weight of nickel boride, and about 47% by weight of a catalyst such as iron boride are mixed and ground for about an hour in an agate mortar and a rotary mixer. Magnesium diboride and nickel boride are the boron containing nanowire producing compounds. In this example, about 7% by weight of a substrate material such as porous silicon is added to the ground mixture. A chemical vapor deposition process is then performed on the ground mixture by subjecting the ground mixture to a carbon containing reactant gas such as methane in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. By using enriched or depleted boron in the catalyst and reactants, the boron filled hybrid carbon nanotubes are enriched and find application in neutron capture. The enriched or depleted boron filled hybrid carbon nanotubes are subsequently purified using, for example, about 69% by weight of an acid such as hydrochloric acid in water and about 69% by weight of a base such as sodium hydroxide in water to remove unwanted byproducts. This treatment functionalizes the enriched or depleted boron filled hybrid carbon nanotubes. The functionalized enriched or depleted boron filled hybrid carbon nanotubes are added to liquid oligomers. The liquid oligomers are cured while keeping the enriched or depleted boron filled hybrid carbon nanotubes in suspension using, for example, high shear mixing or an ultrasound resulting in a high strength polymer composite. The use of enriched or depleted boron enables the polymer composite to be useful for aerospace applications, for example, structures in deep space where cosmic rays are problematic, nuclear reactions for neutron capture, and for medical imaging applications. On using enriched boron, neutron absorption of the high strength polymer composite is increased, and on using depleted boron, the high strength polymer composite is radiation hardened. The radiation shielding properties of the high strength polymer composite are improved, for example, by about 5% to several orders of magnitude. In the case of radiation hardening of the high strength polymer composite, the production of byproducts from the high strength polymer composite by incident radiation is slowed substantially. In an embodiment, solvent methods are married to those using electric fields for added precision and alignment of the boron filled hybrid carbon nanotubes in a particular direction.

Example 24

Consider an example where about 30% by weight of boron oxide, about 30% by weight of boron nitride, and about 20% by weight of a catalyst such as titanium diboride are mixed and ground for about an hour in an agate mortar and a rotary mixer. Boron oxide and boron nitride are the boron containing nanowire producing compounds. In this example, about 20% by weight of a substrate material such as porous silicon is added to the ground mixture. A chemical vapor deposition process is then performed on the ground mixture by subjecting the ground mixture to about 88% by volume of an inert gas such as nitrogen and about 12% by volume of a carbon containing reactant gas such as acetylene in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. By using enriched or depleted boron in the catalyst and reactants, the boron filled hybrid carbon nanotubes are enriched and find application in neutron capture. The enriched or depleted boron filled hybrid carbon nanotubes are subsequently purified using, for example, about 33% by weight of an acid such as nitric acid in water and about 22% by weight of a base such as sodium hydroxide in water to remove unwanted byproducts. This treatment functionalizes the enriched or depleted boron filled hybrid carbon nanotubes. The functionalized enriched or depleted boron filled hybrid carbon nanotubes are added to a metal, for example, iron or stainless steel, and/or ceramic powders, for example, boron carbide or boron nitride, and mixed intimately. The mixing is performed using high shear techniques, for example, high speed mixing, vertical mixing, and milling. The mixed powder is consolidated using high pressure pressing and heating. This process results in a material that is strong and tough. The use of enriched or depleted boron enables the resultant material to be useful for aerospace applications, for example, structures in deep space where cosmic rays are problematic, nuclear reactions for neutron capture, and for medical imaging applications. On using enriched boron, neutron absorption of the resultant material is increased, and on using depleted boron, the resultant material is radiation hardened. The radiation shielding properties of the resultant material are improved, for example, by about 5% to several orders of magnitude. In the case of radiation hardening of the resultant material, the production of byproducts from the resultant material by incident radiation is slowed substantially. In an embodiment, solvent methods are married to those using electric fields for added precision and alignment of the boron filled hybrid carbon nanotubes in a particular direction.

Examples for using boron filled hybrid carbon nanotubes in purification of liquids and gases are disclosed below.

Example 25

Consider an example where about 47.5% by weight of magnesium diboride, about 47.5% by weight of nickel boride, and about 5% by weight of a catalyst such as iron boride are mixed and ground for about an hour in an agate mortar and a rotary mixer. Magnesium diboride and nickel boride are the boron containing nanowire producing compounds. A chemical vapor deposition process is then performed on the ground mixture by subjecting the ground mixture to about 30% by volume of an inert gas such as argon and about 70% by weight of a carbon containing reactant gas such as methane in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. The boron filled hybrid carbon nanotubes are subsequently purified using, for example, about 5% by weight of an acid such as hydrochloric acid in water and about 15% by weight of a base such as sodium hydroxide in water to remove unwanted byproducts. This treatment functionalizes the boron filled hybrid carbon nanotubes. The functionalized boron filled hybrid carbon nanotubes are dispersed in a liquid such as water, forming a suspension. The suspension is vacuum filtered forming a thin, strong, paper like material attached to a filter. The filter is removed with a mechanical means resulting in a nanopaper. If the nanopaper is of a correct density, that is, if the nanopaper has pores of a controllable size, the nanopaper is used as a filter. For example, the density of the nanopaper is about 35% of theoretical maximum density. That is, the density of the nanopaper is approximately about 0.6 gram per cubic centimeter (g/cc) to about 0.9 gram per cubic centimeter. This is similar to an activated carbon filter. The nanopaper surpasses other carbon based filters due to the large number of active sites on the nanopaper. Functional groups are added or removed from the boron filled hybrid carbon nanotubes to tailor the properties of the filter further. The nanopaper filters allow for purification of, for example, up to about 99.999% of unwanted products such as metal ions and organic contaminants. In an embodiment, solvent methods are married to those using electric fields for added precision and alignment of the boron filled hybrid carbon nanotubes in a particular direction.

Example 26

Consider an example where about 41% by weight of magnesium diboride, about 41% by weight of nickel boride, and about 9% by weight of a catalyst such as iron boride are mixed and ground for about an hour in an agate mortar and a rotary mixer. Magnesium diboride and nickel boride are the boron containing nanowire producing compounds. In this example, about 9% by weight of a substrate material such as porous silicon is added to the ground mixture. A chemical vapor deposition process is then performed on the ground mixture by subjecting the ground mixture to about 25% by volume of an inert gas such as argon and about 75% by volume of a carbon containing reactant gas such as methane in a quartz reactor at a reaction temperature of 950° C. at a rate of 10° C./min and at a reaction pressure of 1000 torr for about an hour to produce boron filled hybrid carbon nanotubes. The nanotube producing reactant gas is the carbon containing reactant gas in this example. The boron filled hybrid carbon nanotubes are subsequently purified using, for example, about 27% by weight of an acid such as nitric acid in water and about 66% by weight of a base such as sodium hydroxide in water to remove unwanted byproducts. This treatment functionalizes the boron filled hybrid carbon nanotubes. The functionalized boron filled hybrid carbon nanotubes are dispersed in a liquid such as water, forming a suspension. The suspension is electrospun, or spun by another method that is known in the art, forming a strong bundle. The bundle finds use as a strong wire, as required in suspension style applications, or is woven into a mesh. As a mesh, the bundle is used as a filter. The bundle used as a filter surpasses other carbon based filters due to the large number of active sites on the bundle. Functional groups are added or removed from the boron filled hybrid carbon nanotubes to tailor the properties of the filter further. The bundle filters allow for purification of, for example, up to 99.999% of unwanted products such as metal ions and organic contaminants. In an embodiment, solvent methods are married to those using electric fields for added precision and alignment of the boron filled hybrid carbon nanotubes in a particular direction.

Example 27

Consider an example where about 49% by weight of magnesium diboride, about 49% by weight of nickel boride, and about 1% by weight of a catalyst such as iron boride are mixed and ground for about an hour in an agate mortar and a rotary mixer. Magnesium diboride and nickel boride are the boron containing nanowire producing compounds. In this example, about 1% by weight of a substrate material such as porous silicon is added to the ground mixture. A chemical vapor deposition process is then performed on the ground mixture by subjecting the ground mixture to about 16% by weight of an inert gas such as argon and about 84% by weight of a carbon containing reactant gas such as methane in a quartz reactor at a reaction temperature of 950° C. at a rate of 10° C./min and at a reaction pressure of 760 torr for about an hour to produce boron filled hybrid carbon nanotubes. The nanotube producing reactant gas is the carbon containing reactant gas in this example. The boron filled hybrid carbon nanotubes are subsequently purified using, for example, about 8% by weight of an acid such as hydrochloric acid in water and about 12% by weight of a base such as sodium hydroxide in water to remove unwanted byproducts. The boron filled hybrid carbon nanotubes are added to different filters to tailor or enhance filtration. The boron filled hybrid carbon nanotubes can be functionalized further with different groups that can provide further customization. The boron filled hybrid carbon nanotubes allow for purification of, for example, up to 99.999% of unwanted products such as metal ions and organic contaminants. In an embodiment, solvent methods are married to those using electric fields for added precision and alignment of the boron filled hybrid carbon nanotubes in a particular direction.

Example 28

Consider an example for producing boron filled hybrid carbon nanotubes in chemical reactions. In this example, about 50% by weight of magnesium diboride and about 50% by weight of nickel boride are mixed and ground for about an hour in an agate mortar and a rotary mixer. Magnesium diboride and nickel boride are the boron containing nanowire producing compounds. A chemical vapor deposition process is then performed on the ground mixture by subjecting the ground mixture to about 63% by volume of an inert gas such as argon and about 37% by volume of a carbon containing reactant gas such as methane in a quartz reactor at a reaction temperature of 950° C. at a rate of 10° C./min and at a reaction pressure of 1000 torr for about an hour to produce boron filled hybrid carbon nanotubes. The nanotube producing reactant gas is the carbon containing reactant gas in this example. The boron filled hybrid carbon nanotubes are subsequently purified using, for example, about 100% by weight of an acid such as nitric acid and about 100% by weight of a base such as sodium hydroxide to remove unwanted byproducts. The boron filled hybrid carbon nanotubes act as a catalyst or a reactant in subsequent chemical reactions. Since the boron filled hybrid carbon nanotubes are similar to conventional carbon nanotubes but more disordered, and thus more reactive, the boron filled hybrid carbon nanotubes participate in chemical reactions in much the same way as conventional carbon nanotubes, only more strongly. For example, if modified correctly, the boron filled hybrid carbon nanotubes find use in fuel cells as a catalyst at both an anode and a cathode. The boron filled hybrid carbon nanotubes boost efficiencies of the chemical reactions, for example, from about 5% to about 100%. In an embodiment, solvent methods are married to those using electric fields for added precision and alignment of the boron filled hybrid carbon nanotubes in a particular direction.

Example 29

Consider an example for producing boron filled hybrid carbon nanotubes in electronic applications. Electrically conducting boron filled hybrid carbon nanotubes find applications in very-large-scale integration (VLSI) style interconnects, generic electrical wiring, etc., or use in high power transmission lines. In an embodiment where a boron filled hybrid carbon nanotube is a semiconducting type, the boron filled hybrid carbon nanotube finds applications as a diode to make different types of transistors. The boron filled hybrid carbon nanotube boosts effectiveness of the transistors, for example, by about 5% to about 100%, as measured by a switching rate. In an embodiment, solvent methods are married to those using electric fields for added precision and alignment of the boron filled hybrid carbon nanotubes in a particular direction.

The foregoing examples have been provided merely for the purpose of explanation and are in no way to be construed as limiting of the method for producing boron filled hybrid nanotubes disclosed herein. While the method for producing boron filled hybrid nanotubes has been described with reference to various embodiments, it is understood that the words, which have been used herein, are words of description and illustration, rather than words of limitation. Further, although the method for producing boron filled hybrid nanotubes has been described herein with reference to particular means, materials, and embodiments, the method for producing boron filled hybrid nanotubes is not intended to be limited to the particulars disclosed herein; rather, the method for producing boron filled hybrid nanotubes extends to all functionally equivalent structures, methods and uses, such as are within the scope of the appended claims. It is recognized that numerous variations may be made with respect to relative weight percentages of various constituents in the composition. Those skilled in the art, having the benefit of the teachings of this specification, may effect numerous modifications thereto and changes may be made without departing from the scope and spirit of the method for producing boron filled hybrid nanotubes disclosed herein in its aspects.

We claim:

1. A boron filled hybrid carbon nanotube comprising:
   at least one of one or more single walled carbon nanotubes and one or more multi-walled carbon nanotubes, wherein a core of said boron filled hybrid carbon nanotube comprises one or more boron based nanowires, wherein said at least one of said one or more single walled carbon nanotubes and said one or more multi-walled carbon nanotubes are doped with boron from said one or more boron based nanowires, and wherein boron to carbon ratio in said at least one of said one or more single walled carbon nanotubes and said one or more multi-walled carbon nanotubes is about 1:9;
   said one or more boron based nanowires embedded within the at least one of the one or more single walled carbon nanotubes and the one or more multi-walled carbon nanotubes, wherein said one or more boron based nanowires comprise pure boron; and
   said at least one of one or more single walled carbon nanotubes and one or more multi-walled carbon nanotubes, and said one or more boron based nanowires together forming a core shell, radial carbon nanotube heterostructure.

* * * * *